United States Patent [19]

Miyamoto

[11] Patent Number: 5,436,586

[45] Date of Patent: Jul. 25, 1995

[54] SEMICONDUCTOR INTEGRATED CIRCUIT APPARATUS INCLUDING SUPPLY VOLTAGE CONVERSION CIRCUIT

[75] Inventor: Hiroshi Miyamoto, Hyogo, Japan

[73] Assignee: Mitsubishi Denki Kabushiki Kaisha, Tokyo, Japan

[21] Appl. No.: 151,721

[22] Filed: Nov. 15, 1993

Related U.S. Application Data

[63] Continuation of Ser. No. 732,194, Jul. 19, 1991, abandoned.

[30] Foreign Application Priority Data

Jul. 31, 1990 [JP] Japan ................................. 2-204500

[51] Int. Cl.⁶ .......................... G05F 1/10; H03K 3/02; G11C 7/00
[52] U.S. Cl. ..................................... 327/530; 327/535; 327/198; 365/226; 365/189.09
[58] Field of Search ............... 307/272.3, 296.2, 296.5, 307/296.3, 296.4, 296.1, 296.6; 365/226, 227, 189.09; 327/530, 535, 198

[56] References Cited

U.S. PATENT DOCUMENTS

| | | | |
|---|---|---|---|
| 4,818,904 | 4/1989 | Kobayashi | 307/594 |
| 4,933,902 | 6/1990 | Yamada et al. | 365/189.08 |
| 4,994,689 | 2/1991 | Kikuda et al. | 307/296.2 |
| 4,994,869 | 2/1991 | Matloubian et al. | 357/23.3 |
| 5,121,358 | 6/1992 | Slemmer et al. | 365/227 |
| 5,151,614 | 9/1992 | Yamazaki et al. | 307/272.3 |
| 5,166,545 | 11/1992 | Harrington | 307/272.3 |
| 5,177,375 | 1/1993 | Ogawa et al. | 307/272.3 |
| 5,270,977 | 12/1993 | Iwamoto et al. | 365/226 |
| 5,291,454 | 3/1994 | Yamasaki et al. | 365/226 |
| 5,341,340 | 8/1994 | Hagura | 365/226 |

FOREIGN PATENT DOCUMENTS

3936675A1  6/1990  Germany .

OTHER PUBLICATIONS

IEEE Journal of Solid–State Circuits, "A 45-ns 16 Mbit DRAM with Triple-Well Structure", vol. 24, No. 5, Oct. 1989, pp. 1170–1175.
IEEE Journal of Solid–State Circuits, "A New On-–Chip Voltage Converter for Submicrometer High--Density DRAM's," vol. sc–22, No. 3, Jun. 1987, pp. 437–441.
IEEE Journal of Solid–State Circuits, "Circuit Techniques for a VLSI Memory", vol. sc–18, No. 5, Oct. 1983, pp. 463–470.
IEEE Journal of Solid–State Circuits, "Dual-Operating-Voltage Scheme for a Single 5-V 16-Mbit DRAM", vol. 23, No. 5, Oct. 1988, pp. 1128–1132.
IEEE Journal of Solid–State Circuits "A Tunable CMOS-DRAM Voltage Limiter with Stabilized Feedback Amplifier", vol. 25, No. 5, Oct. 1990, pp. 1129–1135.
IEEE Journal of Solid–State Circuits, "A 4-Mbit DRAM with Half-Internal-Voltage Bit-Line Precharge", vol. sc–21, No. 5, Oct. 1986, pp. 612–617.

*Primary Examiner*—Timothy P. Callahan
*Assistant Examiner*—Trong Phan
*Attorney, Agent, or Firm*—Lowe, Price, LeBlanc & Becker

[57] ABSTRACT

Disclosed is a DRAM including a power-on reset signal generating circuit for outputting a voltage of a predetermined level for a definite period by utilizing a rise of an external supply voltage, and a supply voltage conversion circuit for lowering the external supply voltage to a constant voltage. In this DRAM, the power-on reset signal generating circuit is driven by the external supply voltage not an output voltage of the supply voltage conversion circuit. The output voltage of the supply voltage conversion circuit is applied to various internal circuits including smaller-scale MOS transistors, to drive these internal circuits. Since the supply voltage conversion circuit often includes circuit components with a large time constant in order to decrease power consumption, the output voltage of the supply voltage conversion circuit rises rather slowly than the external supply voltage. However, the power-on reset signal generating circuit receives the external supply voltage as a driving voltage and hence immediately outputs a normal one-shot pulse in response to the supply of power to the DRAM.

1 Claim, 19 Drawing Sheets

SEMICONDUCTOR INTEGRATED CIRCUIT APPARATUS INCLUDING SUPPLY VOLTAGE CONVERSION CIRCUIT

This application is a continuation of application Ser. No. 07/732,194 filed Jul. 9, 1991 now abandoned.

BACKGROUND OF THE INVENTION

1. Field of the Invention

The present invention relates generally to semiconductor integrated circuit apparatus and, more particularly, to a semiconductor integrated circuit apparatus including a supply voltage conversion circuit.

2. Description of the Background Art

In recent years, semiconductor elements in semiconductor integrated circuit apparatus have been reduced in scale in order to increase the operation speed and the integration of the semiconductor integrated circuit apparatus.

With reduction in the scale of MOS transistors, for example, the gate length of the MOS transistors has been decreased. However, if the gate length of the MOS transistors is shorter, hot electrons are liable to be captured into a gate oxide film of the MOS transistors in use. The capture of the hot electrons into the gate oxide film causes a degradation in the reliability of the MOS transistors.

As a higher voltage is applied to the MOS transistors, the hot electrons are more liable to be captured into the gate oxide film. Normally, a supply voltage of 5 V is applied to semiconductor integrated circuit apparatus at present. If the 5 V supply voltage is applied to the smaller-scale MOS transistors, however, the phenomenon that the hot electrons are captured into the gate oxide film becomes prominent.

Thus, such an approach has been made that a voltage lower than a normal supply voltage is applied to the smaller-scale MOS transistors. This approach is realized by provision of a supply voltage conversion circuit for lowering an external supply voltage (5 V) within semiconductor integrated circuit apparatus.

More specifically, the voltage lowered by the supply voltage conversion circuit is applied as a driving voltage to a circuit including the smaller-scale MOS transistors in the semiconductor integrated circuit apparatus.

FIG. 11 shows a simplification of the structure of a DRAM (Dynamic Random Access Memory) described in *IEEE Journal of Solid-State Circuits*, vol. 24, No. 5 (October 1989), pp. 1170-1175 as one example of semiconductor integrated circuit apparatus including a supply voltage conversion circuit.

Description will now be made on the structure of a conventional semiconductor integrated circuit apparatus including a supply voltage conversion circuit with reference to FIG. 11.

A DRAM chip 1 includes a supply voltage conversion circuit VDC, an internal circuit ICKT driven by an output of supply voltage conversion circuit VDC, and an output driver OD directly driven by a supply voltage Vext externally applied to DPAM chip 1.

Supply voltage conversion circuit VDC lowers external supply voltage Vext to a constant voltage. This constant voltage is called an internal supply voltage Vint as compared with external supply voltage Vext. Internal supply voltage Vint is applied to internal circuit ICKT.

DRAM chip 1 externally receives supply voltage Vext and a ground potential Vss (=0 V) at a power supply terminal Tcc and a ground terminal Tss, respectively.

FIG. 12 is a circuit diagram showing one example of supply voltage conversion circuit VDC.

Referring to FIG. 12, this supply voltage conversion circuit includes a generator 300, a regulator 400, and an N channel MOS transistor Qc having its gate receiving an output of regulator 400. An external supply voltage Vext is applied to a source of transistor Qc, and a drain output of transistor QC is employed as an internal supply voltage Vint.

This supply voltage conversion circuit is described in *IEEE J. Solid-State Circuits*, vol. SC-18, pp. 463-470 (October 1983).

Generator 300 includes two diode-connected N channel MOS transistors Qa and Qb, a capacitor Ca, and a ring oscillator 310 driven by external supply voltage Vext for generating a pulse signal with a constant period.

Regulator 400 includes four N channel MOS transistors Qd, Qe, Qf and Qg and a resistance element Rb which are connected in series with each other between the gate of transistor Qc and a ground terminal Tss, a capacitor Cb connected to the gate of transistor Qc, an N channel MOS transistor Qh connected between the gate of transistor Qc and ground terminal Tss, and a resistance element Ra. Each of those four transistors Qd, Qe, Qf and Qg is diode-connected.

Transistors Qa and Qb and resistance element Ra are connected in series with each other between a supply terminal Tcc and the gate of transistor Qc. Capacitor Ca is provided between an output terminal of ring oscillator 310 and a connecting point between transistors Qa and Qb. Transistor Qh has its gate connected to a connecting point between transistor Qg and resistance element Rb.

With a power supply turned on, external supply voltage Vext becomes higher than a potential corresponding to a sum of a threshold voltage of transistor Qa and that of transistor Qb. Accordingly, transistors Qa and Qb are turned on, so that capacitor Cb is charged by a current supplied via transistors Qa and Qb and resistance element Ra from supply terminal Tcc. This raises a potential on the gate (a node Nb) of transistor Qc.

If external supply voltage vext is of an inherent magnitude (normally 5 V), the potential on node Nb reaches a potential corresponding to a sum of respective threshold voltages of the four N channel MOS transistors, so that all transistors Qd, Qe, Qf and Qg are turned on.

If the potential on node Nb is approximately the same as the potential corresponding to the sum of the respective threshold voltages of four transistors Qd, Qe, Qf and Qg, little current flows through resistance element Rb, resulting in a small voltage drop on resistance element Rb. Thus, the potential of the gate (a node Nc) of transistor Qh does not exceed the threshold voltage of transistor Qh, and hence transistor Qh is in an OFF state.

However, if the increase in external supply voltage Vext causes the potential on node Nb to rise to the potential corresponding to the sum of the respective threshold voltages of five transistors Qd, Qe, Qf, Qg and Qh, then the current flowing through resistance element Rb increases, so that the potential on node Nc attains the threshold voltage of transistor Qh. Accordingly, transistor Qh is turned on, so as to decrease the potential on node Nb. If the potential decrease causes the potential on node Nb to be lowered again to around the potential corresponding to the sum of the threshold voltages of four transistors Qd, Qe, Qf and Qg, then transistor Qh is again turned off. Thus, the potential on node Nb is maintained at around the potential corresponding to the sum of the respective threshold voltages of four transistors Qd, Qe, Qf and Qg.

Conversely, if external supply voltage vext decreases for some causes and then the potential on node Nb becomes lower than the potential corresponding to the sum of the respective threshold voltages of four transistors Qd, Qe, Qf and Qg, since at least any one of these four transistors is in the OFF state, the potential on node Nb is no longer maintained by five transistors Qd-Qh. In this case, however, the potential on node Nb is compensated by generator 300.

During the period for which an output potential of ring oscillator 310 is at a high level (corresponding to external supply voltage Vext), since coupling of capacitor Ca increases a potential on a node Na, transistor Qa is turned off and transistor Qb is turned on, so as to supply charges from node Na to capacitor Cb. During the period for which the output potential of ring oscillator 310 is at a low level (corresponding to a ground potential Vss), since transistor Qa is turned on by discharging of capacitor Ca, to increase the potential on node Na. Thus, transistor Qb is also turned on, so that charges are supplied via transistors Qa and Qb to capacitor Cb. In such a circuit operation (hereinafter referred to as a charge pumping operation), the potential on node Nb becomes a slightly higher potential than external supply voltage Vext, and consequently a drain potential Vint of transistor Qc becomes approximately the same potential as external supply voltage Vext.

If the potential on node Nb becomes equal to or higher than the potential corresponding to the sum of the respective threshold voltages of four transistors Qd, Qe, Qf and Qg by such an operation of generator 300, then as described above, the potential on node Nb is maintained at around the potential corresponding to the sum of the threshold voltages of these four transistors by five transistors Qd-Qh.

In this manner, since the gate potential of transistor Qc is almost kept at a constant potential higher than the threshold voltage of transistor Qc under no influence caused by the change of external supply voltage Vext, the drain potential of transistor Qc, i.e., internal supply voltage vint is kept almost constant despite the change of external supply voltage Vext.

Internal circuit ICKT includes a memory cell array MCA, a control signal generating circuit CG, and a power-on reset signal generating circuit PORG.

Control signal generating circuit CG is driven by internal supply voltage Vint to generate an internal control signal for controlling predetermined circuits such as memory cell array MCA and output driver OD in response to externally applied control signals $\overline{RAS}$, $\overline{CAS}$ and $\overline{WE}$.

Memory cell array MCA includes a plurality of memory cells (not shown) arranged in matrix of rows and columns, and a data writing/reading circuit (not shown) for writing data into these memory cells and reading data from the memory cells. The data writing/reading circuit is controlled by a control signal from control signal generating circuit CG to write externally applied data Din into a memory cell designated by an external address signal Add and read the data from the memory cell designated by external address signal Add.

Output driver OD is controlled by a control signal from control signal generating circuit CG to convert a voltage signal of the data read from the memory cell into a signal of a predetermined voltage level. This converted signal is final output data Dout.

In general, the basis of a determination of the logic level of an output data signal Dout is normalized, wherein a voltage not lower than 2.4 V is regarded as of a high level (corresponding to a logic value "1"), and a voltage not higher than 0.4 V is regarded as of a low level (corresponding to a logic value "0"). Thus, output driver OD amplifies a voltage applied as read data from memory cell array MCA so as to conform with this normalization.

Immediately after external supply voltage Vext is applied to DRAM chip 1, power-on reset pulse generating circuit PORG generates a one-shot pulse of a high level (or a low level) to initialize control signal generating circuit CG.

Power-on reset signal generating circuit PORG is provided to force a potential on a predetermined node to a potential which should be applied upon the initiation of the operation of DRAM chip 1 (hereinafter referred to as the initial potential) when external supply voltage Vext is applied to DRAM chip 1, i.e., DRAM chip 1 starts operating.

In order that such circuits as memory cell array MCA and output driver OD controlled by control signal generating circuit CG operate normally after the application of the external supply voltage to power supply terminal Tcc, an output potential of control signal generating circuit CG must be a predetermined potential at the time point when external supply voltage Vext is applied to supply terminal Tcc. Accordingly, a node (not shown) within control signal generating circuit CG, which determines the output potential of control signal generating circuit CG, must inevitably be at a potential which enables the output potential of control signal generating circuit CG to be the above-described predetermined potential, i.e., the initial potential immediately before the application of external supply voltage Vext to power supply terminal Tcc.

However, the node determining the output potential of control signal generating circuit CG includes a node (hereinafter referred to as the potential indefinite node), the potential of which is liable to be a potential different from the initial potential when no external supply voltage Vext is being applied to power supply terminal Tcc. Thus, power-on reset signal generating circuit PORG is provided in order to force the potential on the potential indefinite node to the initial potential immediately after the application of the external supply voltage to power supply terminal Tcc.

More specifically, control signal generating circuit CG is configured such that the initial potential is supplied to the potential indefinite node only during the period for which a one-shot pulse is being output from power-on reset signal generating circuit PORG. Accordingly, since the predetermined potential is absolutely output from control signal generating circuit CG immediately after the application of external power supply voltage Vext to power supply terminal Tcc, such various circuits as memory cell array MCA and output driver OD, controlled by control signal generating circuit CG, subsequently perform normal operations.

Description will now be made on the structure and operation of a conventional power-on reset signal generating circuit by reference to FIGS. 13A and 14. It is assumed in the following description that all nodes in the power-on reset signal generating circuit are at 0 V when a power supply is turned on. FIG. 13A shows the configuration of a power-on reset signal generating circuit disclosed in U.S. Pat. No. 4,818,904 as one example of the power-on reset signal generating circuit PORG of FIG. 11. FIG. 14 is a waveform diagram showing the operation of the power-on reset signal generating circuit of FIG. 13A.

Referring to FIG. 13A, this power-on reset signal generating circuit includes a capacitor 10 connected to a terminal Tint receiving a supply voltage Vcc, an N channel MOS transistor 8 connected in series to capacitor 10, a latch circuit LAT connected to a node N1 between capacitor 10 and transistor 8, inverters 4 and 5 and a diode array DA connected between node N1 and a gate of transistor 8.

A potential on a node N3 between inverter 5 and diode array DA serves as an output POR of this power-on reset signal generating circuit.

An N channel MOS transistor 9 having its gate receiving a potential on a node N2 between transistors 4 and 5 is connected to the gate of transistor 8.

Latch circuit LAT includes an inverter 2 for inverting a potential on node N1, and an inverter 3 for inverting a potential of inverter 2 to apply the inverted potential to node N1.

Diode array DA includes diode-connected N channel MOS transistors 6 and 7.

An output terminal of inverter 2 and the gate of transistor 8 are grounded via capacitors 11 and 12, respectively.

When supply voltage Vcc is applied to the power-on reset signal generating circuit at a time t1 of FIG. 14, the potential on node N1 (FIG. 14(b)) rises to a high level due to coupling of capacitor 10, following a rise of supply voltage Vcc (FIG. 14(a)) to a high level.

Inverter 4 inverts the high level potential on node N1 to supply a low level potential to node N2. Inverter 5 further inverts the low level potential on node N2 to supply the inverted potential to node N3. Thus, the potential on node N3 (FIG. 14(d)) rises to a high level in response to the supply of power.

During the period for which the potential on node N2 is being at a low level, since transistor 9 is in an OFF state, a potential of the gate of transistor 8 (a node N4) is determined on the basis of the potential on node N3. More specifically, if the potential on node N3 is lower than a potential corresponding to a sum of respective threshold voltages of transistors 6 and 7, at least one of transistors 6 and 7 is in the OFF state, and hence capacitor 12 is not charged, so that the potential on node N4 is kept at 0 V. If the potential on node N3 attains the potential corresponding to the sum of the respective threshold voltages of transistors 6 and 7, however, both transistors 6 and 7 are turned on. Accordingly, a potential which is lower than the potential on node N3 by the sum of the respective threshold voltages of transistors 6 and 7 is supplied to node N4 while capacitor 12 is being charged by charges supplied from node N3. Thus, the potential on node N4 starts slowly rising slightly later than the rise of the potential on node N3, as shown in FIG. 14(e).

If the potential on node N4 is lower than the threshold voltage of transistor 8, the potential on node N1 is kept at a high level since transistor 8 is in the OFF state.

When the potential on node N4 reaches the threshold voltage of transistor 8, the potential on node N1 is lowered to a ground potential, i.e., a low level potential since transistor 8 is turned on. Accordingly, the potential on node N1 changes from a high level to a low level as shown in FIG. 14(b) at the time point when the potential on node N4 exceeds the threshold voltage of transistor 8 after the potential on node N3 rises to a high level.

If the potential on node N1 changes to a low level, the potential on node N2 changes from a low level to a high level as shown in FIG. 14(c) by the inversion operation of inverter 4. Also the potential on node N3 subsequently changes by the inversion operation of inverter 5.

Accordingly, the potential on node N3 is, as shown in FIG. 14(d), once attains a high level in response to the supply of power at time t1, and then again falls to a low level at a time t2 when the potential on node N4 reaches the threshold voltage of transistor 8.

If the potential on node N2 attains a high level, the potential on node N4 returns again to 0 V by discharging of capacitor 12 since transistor 9 is turned on. (See FIG. 14(e))

Accordingly, since the potential on node N4 again becomes lower than the threshold voltage of transistor 8 at and after time t2, node N1 is no longer supplied with a ground potential via transistor 8.

However, when transistor 8 is rendered conductive, if the potential on node N1 attains 0 V, an output potential of inverter 2 attains a high level, and hence capacitor 11 is charged. Accordingly, a potential on the output terminal of inverter 2 is kept at a high level. Inverter 3 inverts the output potential of inverter 2 to supply the inverted potential to node N1. Consequently, the potential on node N1 is kept at 0 V also after transistor 8 returns to the OFF state.

As described above, since the potential on node N1 is kept at a low level potential after it once falls to that potential, the potential on node N3 is also fixed at a low level after it falls that low level at time t2. That is, a one-shot pulse of a high level is generated from this power-on reset signal generating circuit only once in response to the supply of power.

When the power-on reset signal generating circuit of FIG. 13A is employed as power-on reset signal generating circuit PORG of FIG. 11, internal supply voltage Vint is used as supply voltage Vcc, and capacitors 11 and 12 and transistors 8 and 9 are connected to ground terminal Tss to receive ground potential Vss. Then, a potential on the potential indefinite node within control signal generating circuit CG is forced to the initial potential in response to the one-shot pulse shown in FIG. 14(d).

FIG. 15 is a diagram showing one example of a circuit to be initialized by the power-on reset signal generating circuit. FIG. 15 illustrates a circuit configuration in the case where an output of the power-on reset signal generating circuit is such a high level one-shot pulse as shown in FIG. 14(d).

Referring to FIG. 15, it is assumed that when power is supplied, respective potentials on respective output terminals N10 and N11 of two NAND gates 100 and 101 constituting a flipflop FL must be at a high level and a low level, respectively.

When NAND gate 100 does not receive an output of an inverter 102, NAND gate 100 is a 2-input NAND gate which receives as an input only a predetermined control signal $\phi 1$ and an output signal of NAND gate 101. On the other hand, NAND gate 101 is a 2-input NAND gate which receives as an input a predetermined control signal $\phi 2$ different from control signal $\phi 1$ and an output signal of NAND gate 100. Control signal $\phi 1$ is a set signal for setting this flipflop, while control signal $\phi 2$ is a reset signal for resetting the flipflop.

When a potential of control signal $\phi 1$ and that of control signal $\phi 2$ are at a high level and a low level, respectively, an output potential of NAND gate 101 attains a high level independently of an output potential of NAND gate 100. Thus, both input potentials to NAND gate 100 attain a high level. Consequently, an output signal of NAND gate 100, which is an output signal of this flipflop FL, attains a low level. In other words, a logic value "1" is set in a node N11 in flipflop FL.

Conversely, when the respective potentials of control signals $\phi 1$ and $\phi 2$ are at a low level and a high level, the output potential of NAND gate 100 attains a high level independently of the output potential of NAND gate 101. Thus, both input potentials to NAND gate 101 attain a high level, and hence the output potential of NAND gate 101 attains a low level. That is, in this case, a node N11 in flipflop FL is reset in a logic value "0".

When both the potentials of control signals $\phi 1$ and $\phi 2$ are at a high level, the output potential of NAND gate 100 is determined on the basis of the output potential of NAND gate 101. Similarly, the output potential of NAND gate 101 is determined on the basis of the output potential of NAND gate 100. Thus, in this case, the respective output potentials of NAND gates 100 and 101 are kept at the same logic level as so far. For example, if both of the potentials of control signals $\phi 1$ and $\phi 2$ attain a high level after a potential on a node N10 is made definite by attainment of only one of control signals $\phi 1$ and $\phi 2$ to a high level, then the potential on node N10 is kept at that definite potential.

However, respective potentials on nodes N10 and N11 are not made definite at any logic level during the period for which no power is being supplied. Thus, if both the potentials of control signals $\phi 1$ and $\phi 2$ attain a high level immediately after the supply of power, the potentials on nodes N10 and N11 become indefinite.

However, if a 3-input NAND gate is used as NAND gate 100, and an output signal POR of the power-on reset signal generating circuit as well as the output potential of NAND gate 101 and control signal $\phi 1$ is input via inverter 102 to this 3-input NAND gate, then the respective potentials on nodes N10 and N11 upon the supply of power are made definite at the initial potential.

Soon after the power supply is turned on, output signal POR of the power-on reset signal generating circuit is at a high level for a definite period, and hence inverter 102 supplies a potential which is at a low level for a definite period to NAND gate 100. Thus, the output potential of NAND gate 100 attains a high level independently of the output potential of NAND gate 101 and that of control signal $\phi 1$. Accordingly, since both input potentials to NAND gate 101 attain a high level, the output potential of NAND gate 101 attains a low level.

Therefore, if the length of the period for which output signal POR of the power-on reset signal generating circuit is being at a high level is not shorter than the time period required until the potential on node N10 is completely made definite at a high level by the output signal of NAND gate 100, then the respective potentials on nodes N10 and N11 serving as potential indefinite nodes are set to the initial potential immediately after the power supply is turned on.

In this manner, the use of the output of the power-on reset signal generating circuit enables the potential on the potential indefinite node to be forced to the initial potential soon after the power supply is turned on.

Such a power-on reset signal generating circuit is widely used in a semiconductor memory device.

While the output of power-on reset signal generating circuit PORG is supplied only to control signal generating circuit CG in FIG. 11, this output is in fact supplied also to potential indefinite nodes of other circuits not shown.

In accordance with the conventional semiconductor integrated circuit apparatus including the power-on reset signal generating circuit, however, there is a case where the power-on reset signal generating circuit outputs no one-shot pulse having a sufficient pulse width and a level for ensuring that a predetermined potential indefinite node is forced to be set in an initial potential.

FIG. 16 is a waveform diagram showing one example of variations of external supply voltage Vext and an output signal of the power-on reset signal generating circuit in the conventional semiconductor integrated circuit apparatus. In FIG. 16(b), a potential waveform which should inherently be output from the power-on reset signal generating circuit is denoted by dotted lines.

Referring to FIG. 16, when external power is supplied to the semiconductor integrated circuit apparatus at a time t3, external supply voltage Vext (FIG. 16(a)) rapidly rises to 5 V, whereas an output (FIG. 16(b)) of the power-on reset signal generating circuit starts slowly rising slightly later than time t3 when the power supply is turned on, but returns to 0 V before it rises to a constant voltage (normally 3–4 V) obtained when supply voltage conversion circuit VDC lowers external supply voltage Vext.

Although it has been unclear why such a phenomenon occurs, the conventional semiconductor integrated circuit apparatus provides the following disadvantages due to the fact that no normal one-shot pulse is obtained from the power-on reset signal generating circuit.

Unless any normal one-shot pulse is obtained from the power-on reset signal generating circuit immediately after the power supply is turned on, a potential indefinite node is not set in an initial potential upon starting of the operation of the semiconductor integrated circuit apparatus.

Referring to FIG. 15, for example, if the potential of output POR of the power-on reset signal generating circuit is at a low level immediately after the supply of power, the output potential of inverter 102 is still at a high level even soon after the supply of power. Thus, even after the power supply is turned on, the output potential of NAND gate 100 remains indefinite, and consequently the output potential of NAND gate 101 also remains indefinite.

Further, if the period for which output signal POR of the power-on reset signal generating circuit is being at a high level is extremely short, then the output potential of inverter 102 attains a high level before the potential on node N10 completely attains a high level in response to the output potential of NAND gate 100. Thus, both the output potentials of NAND gates 100 and 101 become indefinite, and consequently neither of the potentials on nodes N10 and N11 are set to the initial potential.

Unless any potential indefinite node is set in the initial potential soon after the supply of power, a circuit which responds to the potential on this potential indefinite node does not subsequently perform a normal operation, resulting in malfunctions of the entire semiconductor integrated circuit apparatus.

With reference to FIG. 11, for example, unless any normal one-shot pulse is obtained from power-on reset signal generating circuit PORG, the potential indefinite node within control signal generating circuit CG is not set to the initial potential even if external supply voltage Vext is applied to power supply terminal Tcc. Thus, no signal having an expected potential is obtained from control signal generating circuit CG. Consequently, since the data writing/reading circuit does not subsequently perform normal data writing/reading operations in memory cell array MCA controlled by control signal generating circuit CG, a basic operation of DRAM chip 1 is not accomplished.

SUMMARY OF THE INVENTION

One object of the present invention is to provide a semiconductor integrated circuit apparatus which can ensure the setting of a potential indefinite node in an initial potential in response to supply of power.

Another object of the present invention is to ensure the acquirement of a one-shot pulse having a predetermined level and a predetermined width from a power-on reset signal generating circuit in response to supply of power.

A further object of the present invention is to eliminate a cause that a normal one-shot pulse cannot be obtained from a power-on reset signal generating circuit in a conventional semiconductor integrated circuit apparatus.

A still further object of the present invention is to ensure the acquirement of a normal output waveform from a power-on reset signal generating circuit in a semiconductor integrated circuit apparatus including a smaller-scale MOS transistor.

To accomplish the above objects, according to one aspect, a semiconductor integrated circuit apparatus in accordance with the present invention includes: an external terminal for receiving an external supply voltage; an internal circuit to be driven by a voltage lower than the external supply voltage; an internal supply voltage applying circuit connected to the external terminal for lowering the external supply voltage to the lower voltage to apply the lowered voltage to the internal circuit; and a signal generating circuit connected to the external terminal for generating a signal of a predetermined potential level in order to initialize the internal circuit for only a definite period after the application of the external supply voltage to the external terminal by utilizing a rise of the potential of the external terminal.

The internal circuit includes a potential indefinite node, and the signal of the predetermined potential level generated by the signal generating circuit is employed to force the potential indefinite node to be set in an initial potential.

According to another aspect, a semiconductor integrated circuit apparatus in accordance with the present invention includes: an external terminal for receiving an external supply voltage; a memory circuit for storing data therein; a control circuit for controlling an operation of the memory circuit; a voltage lowering circuit connected to the external terminal for lowering the external supply voltage to apply the lowered voltage to the memory circuit; and an initializing circuit connected to the external terminal for generating a signal for initializing the control circuit for a definite period by utilizing a rise of the potential of the external terminal.

The control circuit includes a potential indefinite node, and the signal generated by the initializing circuit is employed to force the potential indefinite node to be set in an initial potential.

Preferably, each of the signal generating circuit and the initializing circuit includes: a node; an element for coupling the potential of the external terminal to the node; a forcing circuit responsive to the potential of the node rising to a level not lower than a predetermined level for forcing the potential of the node to be set in a predetermined lower potential; and a circuit for holding the potential on the node at the predetermined forced lower potential.

The forcing circuit includes: a first inversion circuit for inverting the potential on the node; a second inversion circuit for inverting an output potential of the first inversion circuit; a delay circuit for delaying an output signal of the second inversion circuit; and a switching element coupled between the node and the predetermined lower potential and controlled by a delay output of the delay circuit.

The inventors have taken note of the fact that a power-on reset signal generating circuit is driven by an output Vint of a supply voltage conversion circuit VDC in a conventional DRAM chip, and have studied the characteristics of supply voltage conversion circuit VDC and those of the power-on reset signal generating circuit. As a result, they have discovered that an output waveform of supply voltage conversion circuit VDC is the cause that a normal one-shot pulse is not output from the power-on reset signal generating circuit.

An explanation will now be made on the relationship between input waveforms and output waveforms of supply voltage conversion circuit VDC by reference to FIGS. 12 and 9.

FIG. 9 is a waveform diagram showing waveforms of rises of an external supply voltage Vext and an internal supply voltage Vint.

Referring to FIG. 9, when a power supply is turned on at a time t3, external supply voltage Vext rapidly rises and reaches an inherent potential at a time t6, as shown by the solid line.

In an internal supply voltage conversion circuit, external supply voltage Vext is required to attain a potential corresponding to a sum of a threshold voltage of a transistor Qa and that of a transistor Qb in order that both transistors Qa and Qb are turned on. In general, a threshold voltage of an N channel MOS transistor is approximately 0.7 V. Thus, a capacitor Cb is charged merely by operations other than the above-described charge pumping operation during the period between time t3 when the power supply is turned on and the time when external supply voltage Vext becomes approximately 1.4 V.

A ring oscillator 310 starts operating at the same time when a supply voltage is applied; however, if external supply voltage Vext for driving ring oscillator 310 is lower, then an output frequency of ring oscillator 310 is lower. Thus, a capacitor Ca is not sufficiently charged or discharged, and hence the charge pumping operation, in which transistors Qa and Qb charge capacitor Cb, is not sufficiently achieved.

Accordingly, since a gate potential of transistor Qc hardly rises until external supply voltage Vext is close to its inherent potential to some extent, transistor Qc is in an OFF state.

In general, ring oscillator 310 has its inherent output frequency set lower in order to reduce power consumption. Therefore, capacitor Cb requires a longer time to be completely charged by the charge pumping operation by transistors Qa and Qb. Thus, even after external supply voltage Vext exceeds the potential corresponding to the sum of the respective threshold voltages of transistors Qa and Qb, the gate potential of transistor Qc rises at a lower speed corresponding to the output frequency of ring oscillator 310 and the respective threshold voltages of transistors Qa and Qb.

Consequently, internal supply voltage Vint rises at a rather lower speed than the rising speed of external supply voltage Vext at and after time t3 when the power supply is turned on, as shown by the dotted line in FIG. 9. Then, at a time t7 which is far behind time t6 when external supply voltage Vext attains the inherent potential, the gate potential of transistor Qc becomes almost stable at a constant potential (corresponding to the sum of the respective threshold voltages of four N channel MOS transistors), so that internal supply voltage Vint is stabilized at the inherent potential.

Accordingly, referring to FIG. 11, if supply voltage conversion circuit VDC includes circuit components having a large time constant such as an oscillator with a lower output frequency and a transistor with a higher threshold voltage, then internal supply voltage Vint does not rise rapidly even if external supply voltage Vext is applied to power supply terminal Tcc. Description will now be made on an operation of power-on reset signal generating circuit PORG in the case where internal supply voltage Vint rises at a lower speed in DRAM chip 1 of FIG. 11, by reference to FIGS. 13B and 10.

FIG. 13B is a circuit diagram showing in more detail the configuration of the power-on reset signal generating circuit shown in FIG. 13A. FIG. 10 is a waveform diagram showing an operation of the power-on reset signal generating circuit of FIG. 13A in the case where a driving voltage rises slowly.

With reference to FIG. 13B, the respective four inverters 2-5 in the power-on reset signal generating circuit of FIG. 13A include respective P channel MOS transistors 21, 31, 41 and 51 and respective N channel MOS transistors 22, 32, 42 and 52 connected in series with each other between a terminal Tint for receiving internal supply voltage Vint and a ground terminal Tss.

When a power supply is turned on in DRAM chip 1 at a time t3, external supply voltage Vext rapidly rises and becomes stable at a maximal voltage (normally 5 V) at time t6, as shown in FIG. 10(a). On the other hand, internal supply voltage Vint becomes stable at a constant voltage (normally 3 V to 4 V) at time t7 far behind time t6 when external supply voltage Vext becomes stable at the maximal voltage as shown in FIG. 10(b).

When internal supply voltage Vint starts rising, a potential on a node N1 (FIG. 10(c)) starts rising at approximately the same speed as internal supply voltage Vint by coupling of capacitor 10 in FIG. 13B.

During the period for which the potential on node N1 is lower than a threshold voltage of transistor 41, transistor 41 is turned on, to supply internal supply voltage Vint to a node N2. If the potential on node N1 exceeds a threshold voltage of transistor 42, then transistor 42 is turned on, to decrease a potential on node N2 to 0 V. Since internal supply voltage Vint rises slowly, internal supply voltage Vint is also approximately 0 V during the period for which the potential on node N1 is lower than the threshold voltage of transistor 41.

If the potential on node N2 (FIG. 10(d)) is at a low level, transistor 51 is turned on, to supply internal supply voltage Vint to a node N3. Accordingly, a potential on node N3 gradually rises in accordance with the rising of internal supply voltage Vint until the potential on node N2 exceeds a threshold voltage of transistor 52 at and after time t3 when the power supply is turned on, as shown in FIG. 10(e).

Thus, the potential on node N3 reaches a potential corresponding to a sum of respective threshold voltages of transistors 6 and 7, spending a long time after time t3 when the power supply is turned on.

Transistor 9 is normally OFF during the period for which the potential on node N2 is being at a low level. Accordingly, a potential on a node N4 starts slowly rising in accordance with the rising of the potential on node N3 by charging of capacitor 12 from a time t10 far behind time t3 when the power supply is turned on, as shown in FIG. 10(f).

If the potential on node N4 attains the threshold voltage of transistor 8, then the potential on node N1 is lowered to 0 V by transistor 8. Thus, if the potential on node N3 attains a potential corresponding to a sum of the respective threshold voltages of transistors 6, 7 and 8, the potential on node N1 is abruptly lowered to 0 V.

The potential on node N3 is equal to internal supply voltage Vint during the period for which the potential on node N2 is being at a low level. On the other hand, the potential on node N1 is equal to internal supply voltage Vint during the period for which transistor 8 is OFF. Accordingly, as shown in FIG. 10(c), the potential on node N1 reaches the potential corresponding to the sum of the respective threshold voltages of transistors 6-8 at a time t8 far behind time t3 when the power supply is turned on, and then abruptly decreases to 0 V. More specifically, after the power supply is turned on, the potential on node N1 returns to 0 V before rising to the potential corresponding to a high level.

If the potential on node N1 reaches 0 V, transistor 41 is completely turned on, to supply internal supply voltage Vint to node N2. Thus, as shown in FIG. 10(d), the potential on node N2 starts abruptly rising from fall time t8 of node N1, and exhibits the same potential change as that of internal supply voltage Vint at and after a time t9 when the potential on node N1 is completely 0 V.

If the potential on node N2 exceeds the threshold voltage of transistor 52, transistor 52 is turned on, so that charges are discharged via transistor 52 from node N3. Accordingly, as shown in FIG. 10(e), the potential on node N3 rises up to the potential corresponding to the sum of the respective threshold voltages of three transistors 6-8 at time 8, then starts abruptly falling to 0 V. More specifically, also the potential on node N3 returns to 0 V before rising to the potential corresponding to a high level, like the potential on node N1.

If the potential on node N3 returns to 0 V, transistors 6 and 7 are turned off, while transistor 9 is turned on in response to the potential rise of node N2. Accordingly, as shown in FIG. 10(f), the potential on node N4 abruptly falls to 0 V at and after time t8 when the potential on node N2 starts rising. Thus, transistor 8 is again turned off. However, the potential on node N1 is held at 0 V by an operation of latch circuit LAT.

More specifically, since transistor 21 is turned on to supply internal supply voltage Vint to capacitor 11 at the time point when the potential on node N1 attains a low level, capacitor 11 is gradually charged at and after that time point. The charging of capacitor 11 causes the gate potential of transistor 32 to rise and be held at a potential higher than the threshold voltage of transistor 32. Accordingly, the potential on node N1 is held at 0 V also at and after time t9 independently of the ON/OFF state of transistor 8.

As described above, if the voltage to be applied to terminal Tint for receiving a driving voltage rises very slowly, the potential on node N1 returns to 0 V before completely rising up to the potential corresponding to a high level. Therefore, the output of the power-on reset signal generating circuit provided immediately after the supply of power (FIG. 10(a)) represents a waveform of a lower voltage level which rises more slowly as compared to the inherent output waveform (FIG. 14(d)). That is, the power-on reset signal generating circuit does not output any normal one-shot pulse.

Thus, as mentioned above, in the semiconductor integrated circuit apparatus according to the present invention, the circuit for generating a signal of a predetermined voltage level for a definite period by utilizing the rising of a drive voltage is driven by an external supply voltage. The external supply voltage rapidly rises differently from an internal supply voltage.

Therefore, in accordance with the present invention, a normal one-shot pulse is securely output in response to the supply of power from the power-on reset signal generating circuit in the semiconductor integrated circuit apparatus including the supply voltage conversion circuit. Accordingly, after the power supply is turned on, the circuit to be initialized by the power-on reset signal generating circuit reliably performs a normal operation, resulting in an enhancement in the reliability of the entire semiconductor integrated circuit apparatus.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
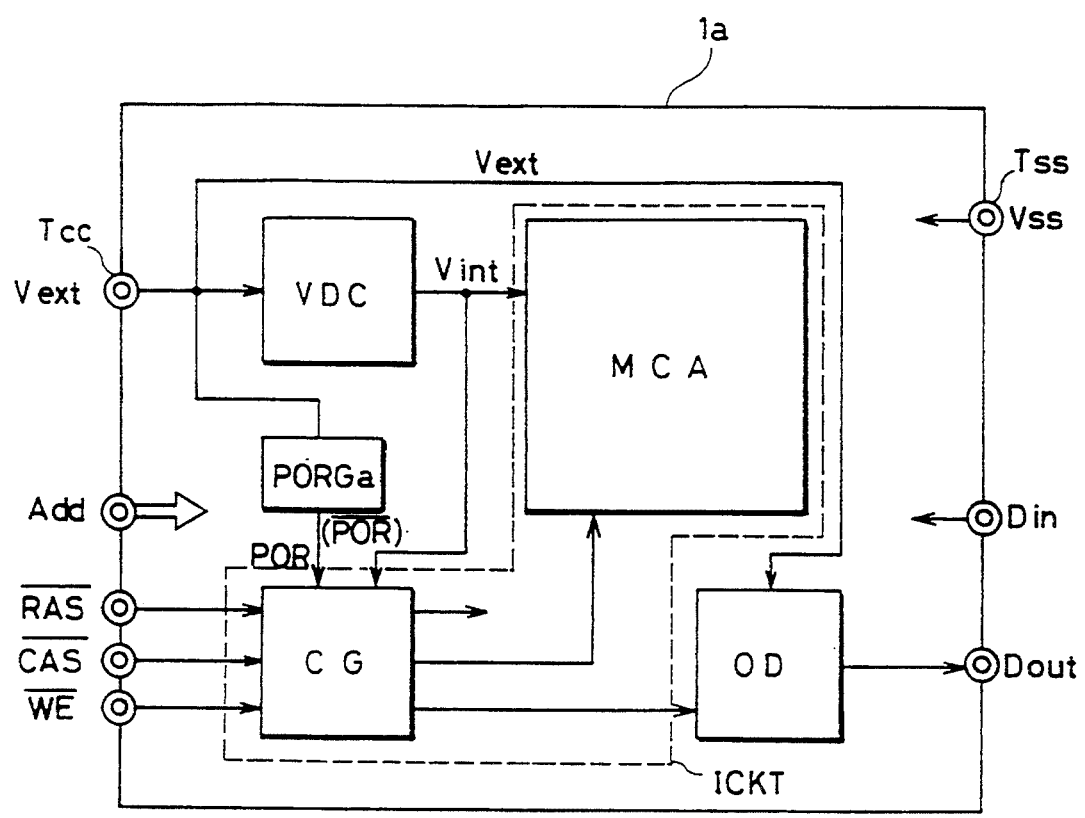
FIG. 1 is a schematic block diagram showing an overall structure of a semiconductor integrated circuit apparatus according to one embodiment of the present invention.

FIG. 1 is a schematic block diagram showing an overall structure of a DRAM chip of one embodiment of the present invention.

Referring to FIG. 1, a part of an internal circuit of this DRAM chip 1a includes a MOS transistor reduced in scale in accordance with a scaling law. Thus, DRAM chip 1a includes a supply voltage conversion circuit VDC for lowering an external supply voltage Vext.

Figure 11:
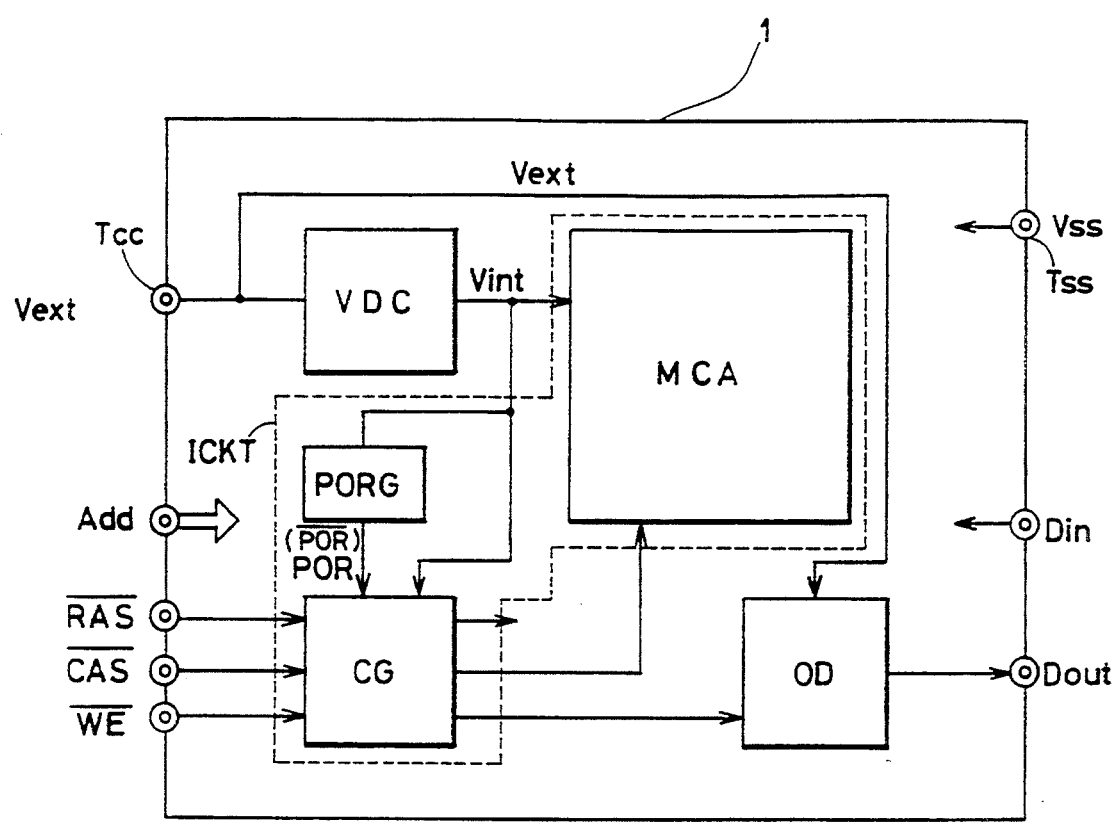
FIG. 11 is a schematic block diagram showing an overall structure of a conventional semiconductor integrated circuit apparatus including a supply voltage conversion circuit.
Figure 12:
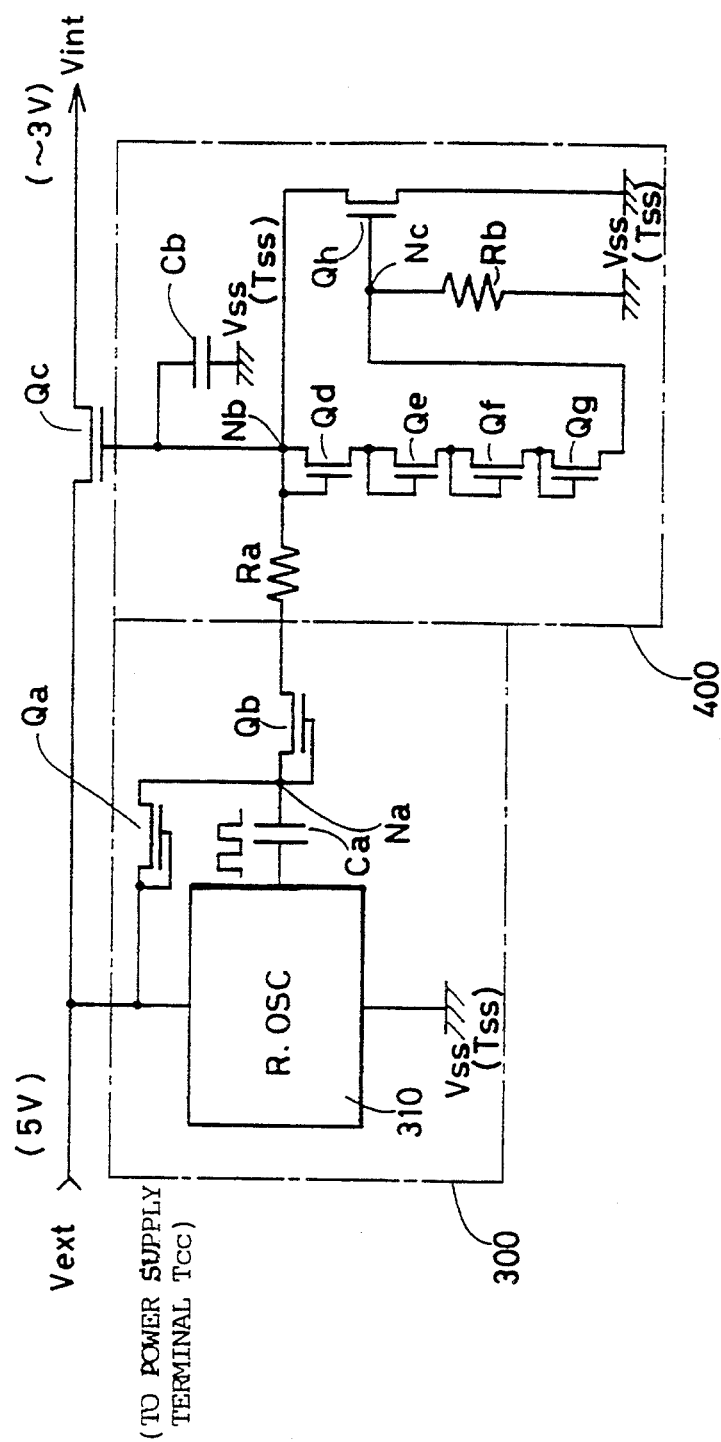
FIG. 12 is a circuit diagram showing one example of supply voltage conversion circuits for use in FIG. 11.

Unlike the conventional DRAM chip shown in FIG. 11, this DRAM chip 1a includes a power-on reset signal generating circuit PORGa directly driven by external supply voltage Vext. In other words, an output Vint of supply voltage conversion circuit VDC is not employed to drive power-on reset signal generating circuit PORGa.

Since the structure and the operation of other parts of DRAM chip 1a are similar to those of conventional DRAM chip 1 shown in FIG. 11, a description thereof will not be repeated here.

In the conventional DRAM chip, the power-on reset signal generating circuit is driven by output Vint of supply voltage conversion circuit VDC. As described above, however, it is considered that the cause that any normal one-shot pulse is not output from the power-on reset signal generating circuit is that an output voltage of supply voltage conversion circuit VDC rises slowly.

Thus, in this embodiment, power-on reset signal generating circuit PORGa is driven by external supply voltage Vext which rises at a higher speed. This ensures the output of a normal one-shot pulse from power-on reset signal generating circuit PORGa immediately after external supply voltage Vext is applied to power supply terminal Tcc.

Figure 2A:
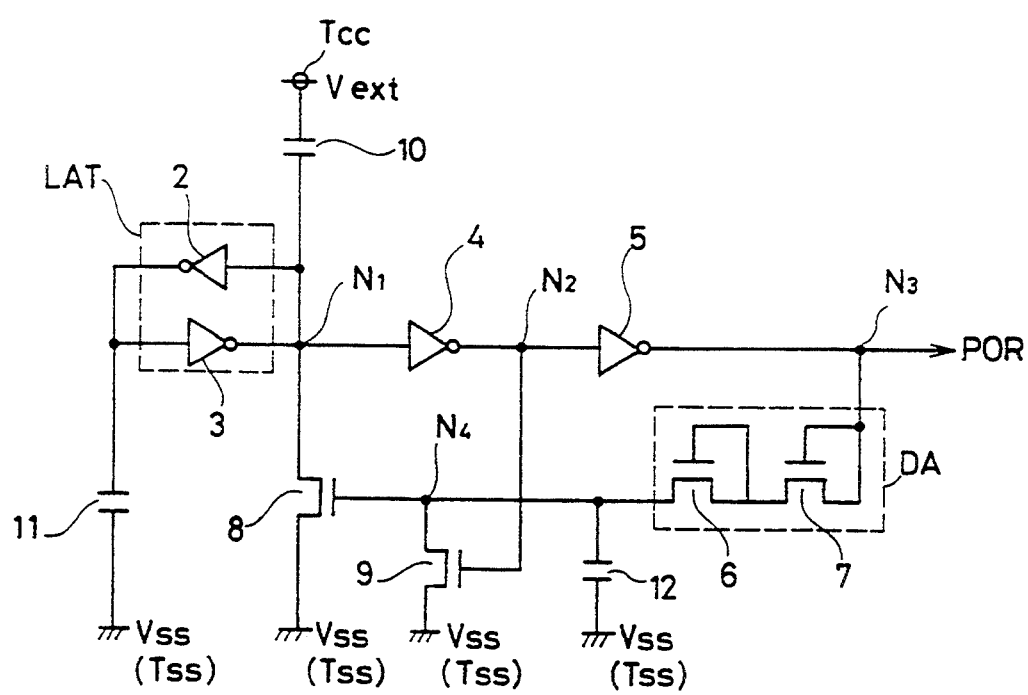
FIGS. 2A and 2B are circuit diagrams showing the configuration of a power-on reset signal generating circuit of FIG. 1.
Figure 2B:
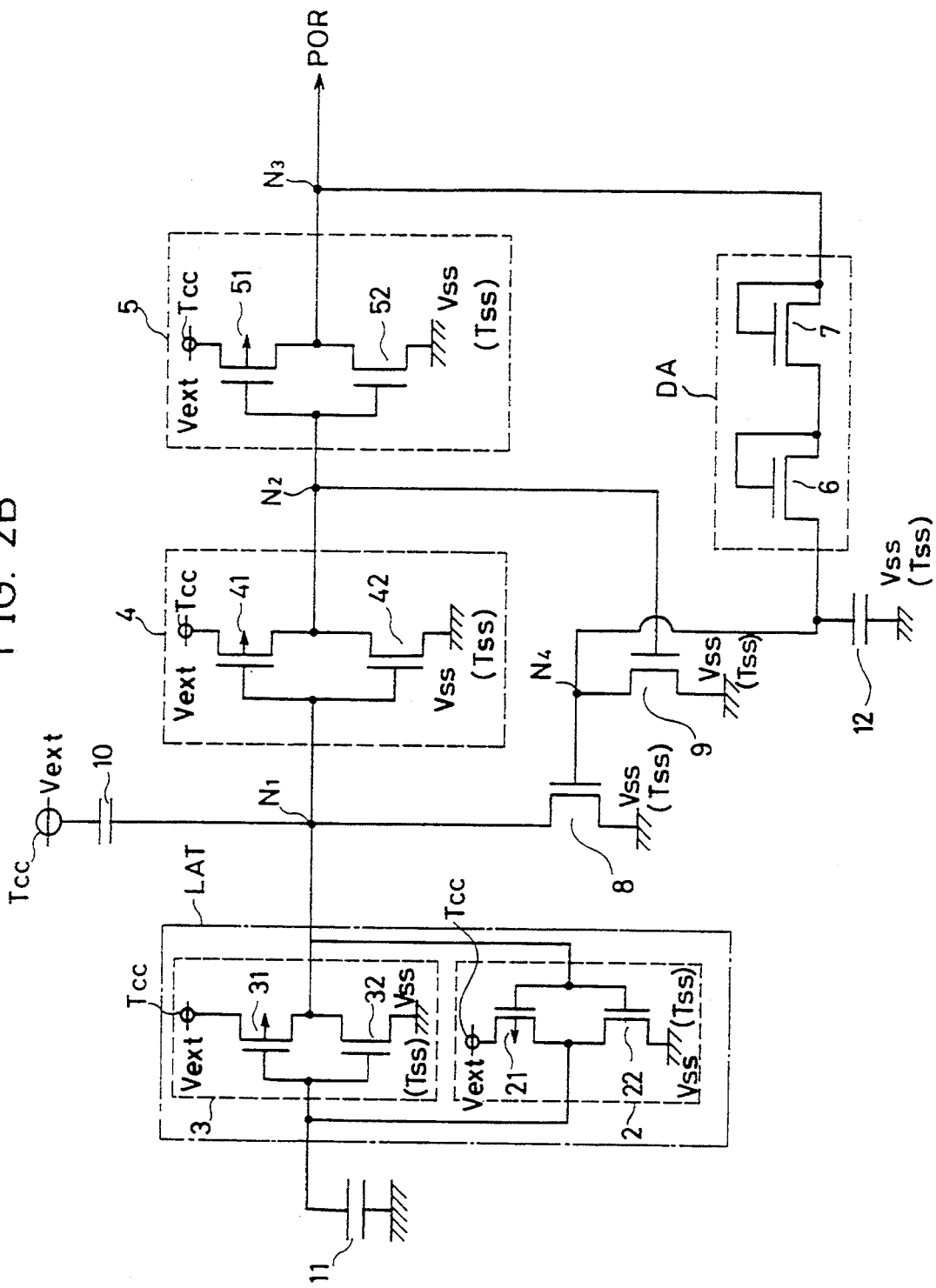

FIG. 2A is a circuit diagram showing one example of power-on reset signal generating circuit PORGa of FIG. 1. FIG. 2B is a circuit diagram showing in more detail the configuration of the power-on reset signal generating circuit of FIG. 2A.

Referring to FIGS. 2A and 2B, this power-on reset signal generating circuit includes a capacitor 10 and an N channel MOS transistor 8 connected in series with each other between power supply terminal Tcc and a ground terminal Tss of FIG. 1, and two inverters 4 and 5 connected in series with each other between a node N1 of capacitor 10 and transistor 8 and an output terminal of the power-on reset signal generating circuit (a node N3). The power-on reset signal generating circuit further includes two N channel MOS transistors 6 and 7 connected in series with each other between node N3 and a gate of transistor 8. Respective diode-connected transistors 6 and 7 constitute a diode array DA. The power-on reset signal generating circuit further includes a latch circuit LAT and a capacitor 11 connected in series with each other between node N1 and ground terminal Tss.

Latch circuit LAT includes two inverters 2 and 3 connected in anti-parallel between node N1 and capacitor 11.

The power-on reset signal generating circuit further includes an N channel MOS transistor 9 connected between the gate of transistor 8 and ground terminal Tss and having its gate receiving a potential on a node N2 between inverters 4 and 5, and a capacitor 12 provided between the gate of transistor 8 and ground terminal Tss.

Respective four inverters 2-5 include respective P channel MOS transistors 21, 31, 41 and 51 and respective N channel MOS transistors 22, 32, 42 and 52, connected in series with each other between power supply terminal Tcc and ground terminal Tss.

Figure 3:
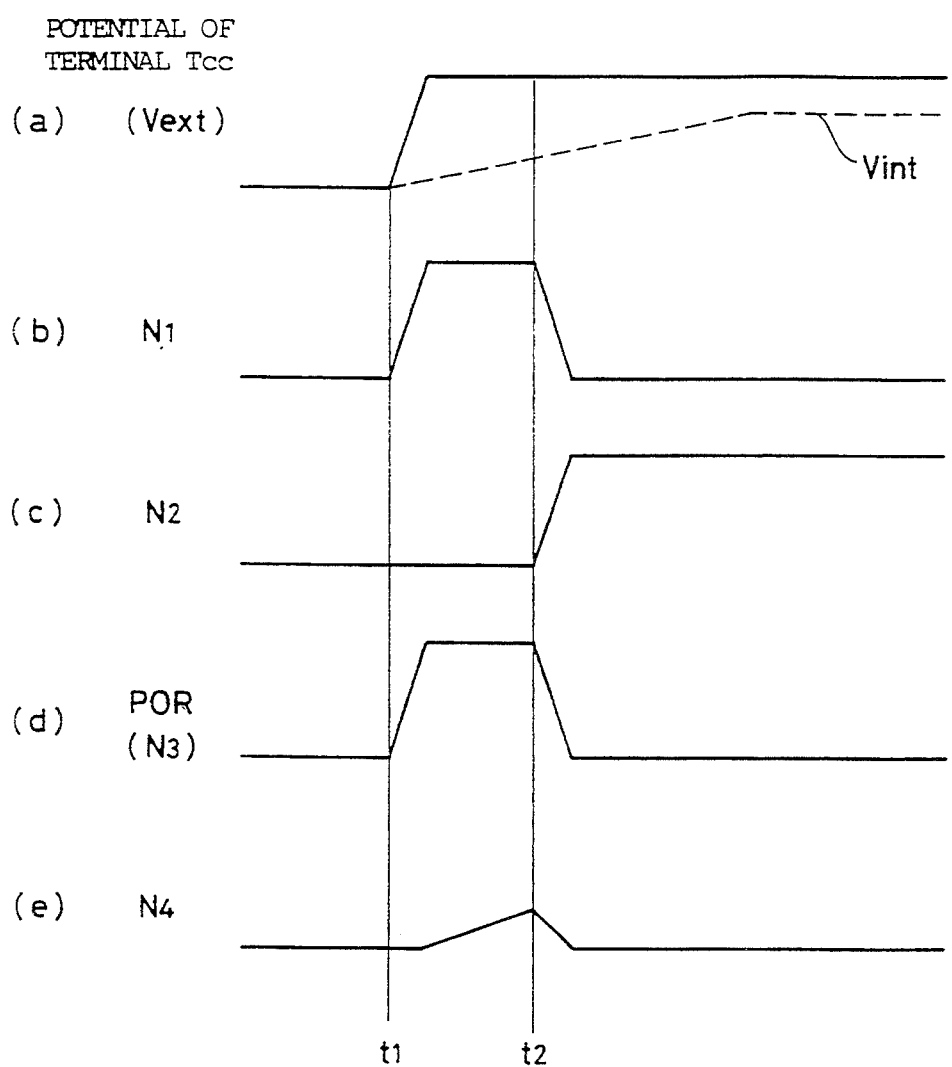
FIGS. 3(a)–(e) is a waveform diagram for use in explaining an operation of the power-on reset signal generating circuit of FIGS. 2A and 2B.

Description will now be made on an operation of this power-on reset signal generating circuit by reference to FIG. 3. FIG. 3 is a waveform diagram showing the operation of the power-on reset signal generating circuit.

If external supply voltage Vext is applied to power supply terminal Tcc at a time t1, then a potential on node N1 (FIG. 3(b)) rises to a high level by coupling of capacitor 10 in accordance with the rising of external supply voltage Vext (FIG. 3(a)) to a high level.

Inverter 4 inverts the high level potential on node N1 to supply a low level potential to node N2. Inverter 5 further inverts the low level potential on node N2 to supply the inverted potential to node N3. Accordingly, a potential POR on node N3 (FIG. 3(d)) rises to a high level in response to the supply of power.

Since transistor 9 is in an OFF state during the period for which the potential on node N2 is being at a low level, a potential of the gate of transistor 8 (a node N4) is determined on the basis of the potential on node N3. More specifically, if the potential on node N3 is lower than a potential corresponding to a sum of respective threshold voltages of transistors 6 and 7, then since at least one of transistors 6 and 7 is in the OFF state, capacitor 12 is not charged so that the potential on node N4 is held at 0 V. However, if the potential on node N3 reaches the potential corresponding to the sum of the respective threshold voltages of transistors 6 and 7, transistors 6 and 7 are both turned on. Accordingly, a potential which is lower than the potential on node N3 by the sum of the respective threshold voltages of transistors 6 and 7 is applied to node N4, with capacitor 12 being charged by charges applied from node N3. Thus, as shown in FIG. 3(e), the potential on node N4 starts slowly rising slightly later than the rising of the potential on node N3.

If the potential on node N4 is lower than the threshold voltage of transistor 8, the potential on node N1 is held at a high level since transistor 8 is in the OFF state.

If the potential on node N4 attains the threshold voltage of transistor 8, transistor 8 is turned on, and hence the potential on node N1 decreases to a ground potential, i.e., a low level potential. Accordingly, the potential on node N1 changes from a high level to a low level as shown in FIG. 3(b) at the time point when the potential on node N4 exceeds the threshold voltage of transistor 8 after the potential on node N3 rises to a high level.

If the potential on node N1 changes to a low level, the potential on node N2 changes from a low level to a high level as shown in FIG. 3(c) by an inverting operation of inverter 4. Also, the potential on node N3 subsequently changes by an inverting operation of inverter 5.

Accordingly, as shown in FIG. 3(d), the potential on node N3 once attains a high level in response to the supply of power at a time t1 and then falls to a low level again at a time t2 when the potential on node N4 attains the threshold voltage of transistor 8.

If the potential on node N2 attains a high level, transistor 9 is turned on, and hence the potential on node N4 returns to 0 V again by discharging of capacitor 12. (See FIG. 3(e))

Accordingly, since the potential on node N4 becomes lower than the threshold voltage of transistor 8 again at and after time t2, a ground potential is no longer supplied via transistor 8 to node N1.

If the potential on node N1 is set to 0 V by conduction of transistor 8, however, an output potential of inverter 2 attains a high level, so that capacitor 11 is charged. Thus, a potential of an output terminal of inverter 2 is held at a high level. Inverter 3 inverts the output potential of inverter 2 to supply the inverted potential to node N1. As a result, the potential on node N1 is held at 0 V even after transistor 8 is again turned off.

As described above, if once the potential on node N1 falls to a low level, the potential is kept held at that low-level potential thereafter, and hence the potential on node N3 is also fixed to a low level after falling to the low level at time t2. That is, a one-shot pulse of a high level is generated only once from this power-on reset signal generating circuit in response to the supply of power.

The pulse width of this one-shot pulse corresponds to a time period required from the time when the potential on node N3 attains a high level to the time when the potential on node N4 exceeds the threshold voltage of transistor 8, and hence the pulse width is determined on the basis of the respective threshold voltages of transistors 6 and 7 and the capacitance of capacitor 12.

Figure 13A:
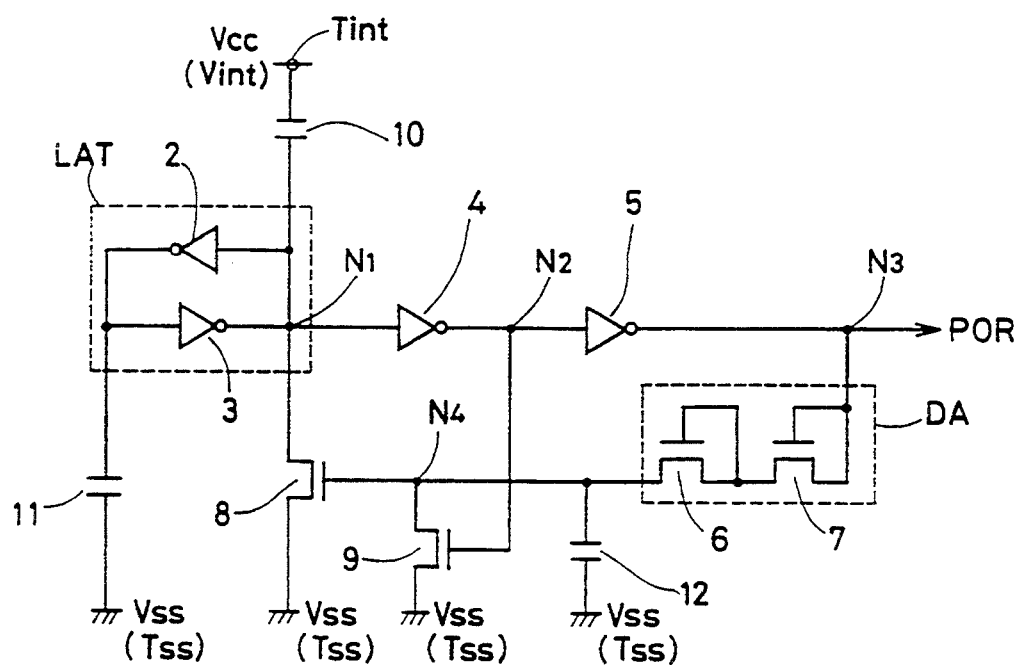
FIGS. 13A and 13B are circuit diagrams showing one example of the configuration of a circuit for use as a power-on reset signal generating circuit of FIG. 11.
Figure 13B:
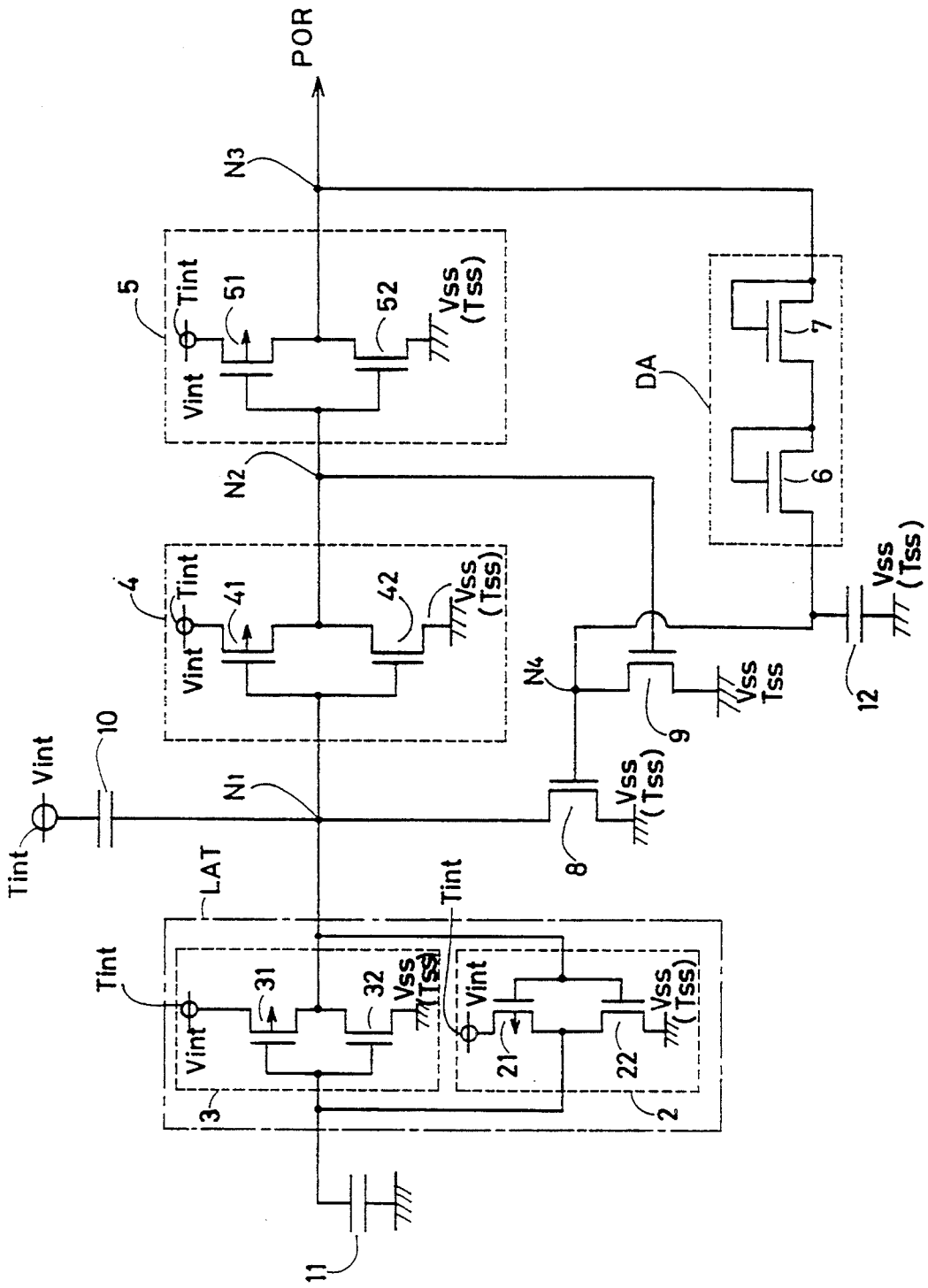
Figure 14:
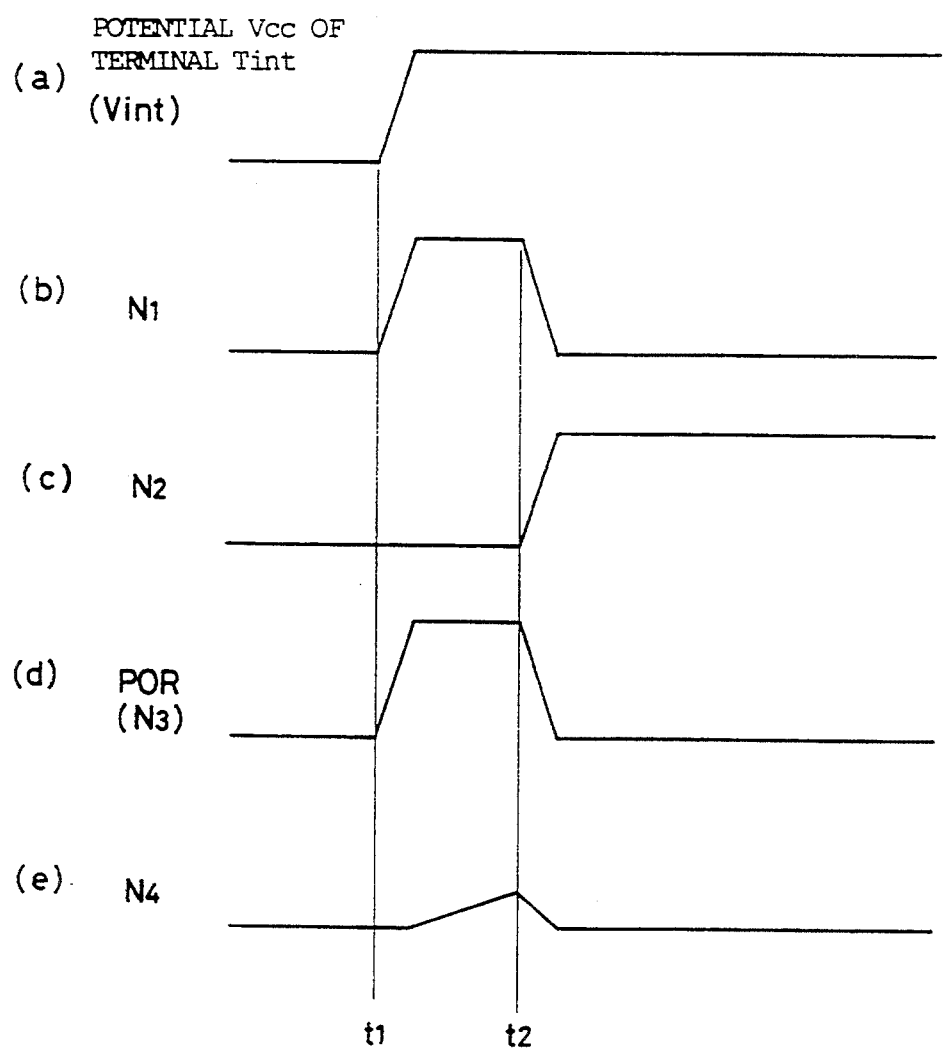
FIGS. 14(a)–(e) are a waveform diagram for use in explaining an operation of the circuit shown in FIGS. 13A and 13B.
Figure 15:
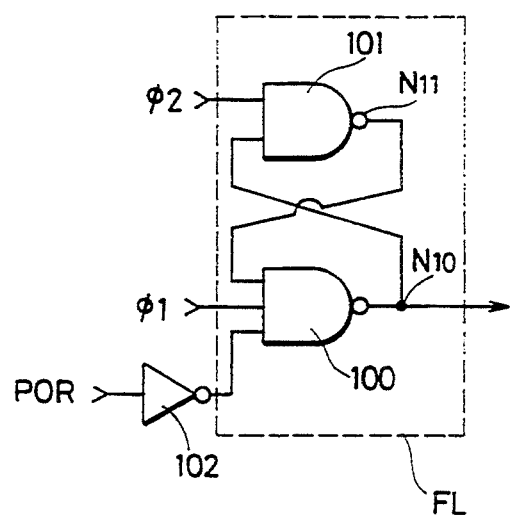
FIG. 15 is a conventional circuit diagram showing one example of a circuit to be initialized by a power-on reset signal generating circuit.
Figure 16:
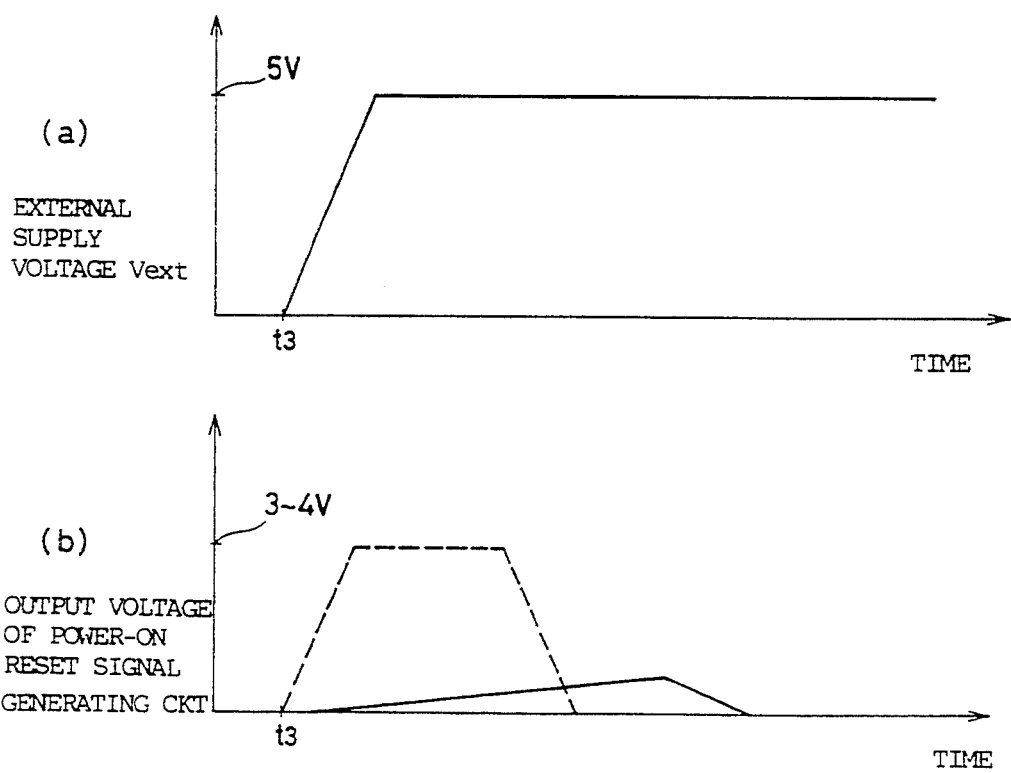
FIG. 16(a)–(b) are a diagram showing one example of waveforms of an external supply voltage and an output voltage of the power-on reset signal generating circuit for use in explaining problems of the conventional semiconductor integrated circuit apparatus.

As mentioned above, the operation of the power-on reset signal generating circuit is similar to that of the conventional power-on reset signal generating circuit shown in FIGS. 13A and 13B. In this embodiment, however, since capacitor 10 and all inverters 2–5 are connected to external power supply terminal Tcc, capacitor 10 and all inverters 2–5 are driven by external supply voltage Vext which rises at a higher speed.

Thus, since the potential on node N3 immediately attains a high level by transistor 51 in response to the supply of power to DRAM chip 1a, the potential on node N1 has already completely risen to the potential corresponding to a high level at time t2 when the potential on node N4 reaches the threshold voltage of transistor 8. Accordingly, the respective potentials on nodes N1 and N3 are held at the potential corresponding to a high level for a sufficiently long time during the period between time t1 of the supply of power and time t2 when the potential on node N4 reaches the threshold voltage of transistor 8.

In other words, referring to FIG. 1, a one-shot pulse of a high level is securely output from power-on reset signal generating circuit PORGa in response to the supply of power to DRAM chip 1a.

Accordingly, in DRAM 1a of the foregoing embodiment, a potential indefinite node (not shown) in a control signal generating circuit CG is securely set in an initial potential immediately after the supply of power to DRAM 1a. This ensures normal operations of memory cell array MCA and output driver OD upon and after the supply of power, resulting in an enhancement in the reliability of DRAM 1a.

While the circuit configured such that a one-shot pulse of a high level is output is employed as power-on reset signal generating circuit PORGa in the foregoing embodiment, a circuit configured such that a one-shot pulse of a low level is output in response to the supply of power may be employed.

Figure 4A:
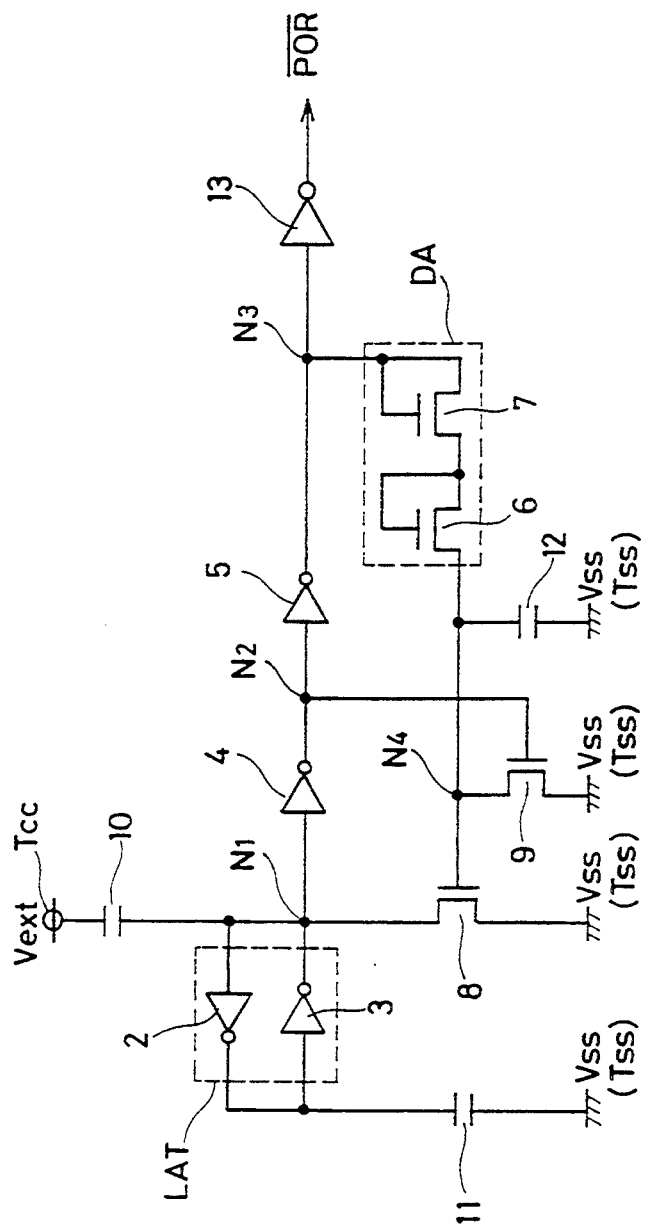
FIGS. 4A and 4B are circuit diagrams showing another example of the power-on reset signal generating circuit of FIG. 1.
Figure 4B:
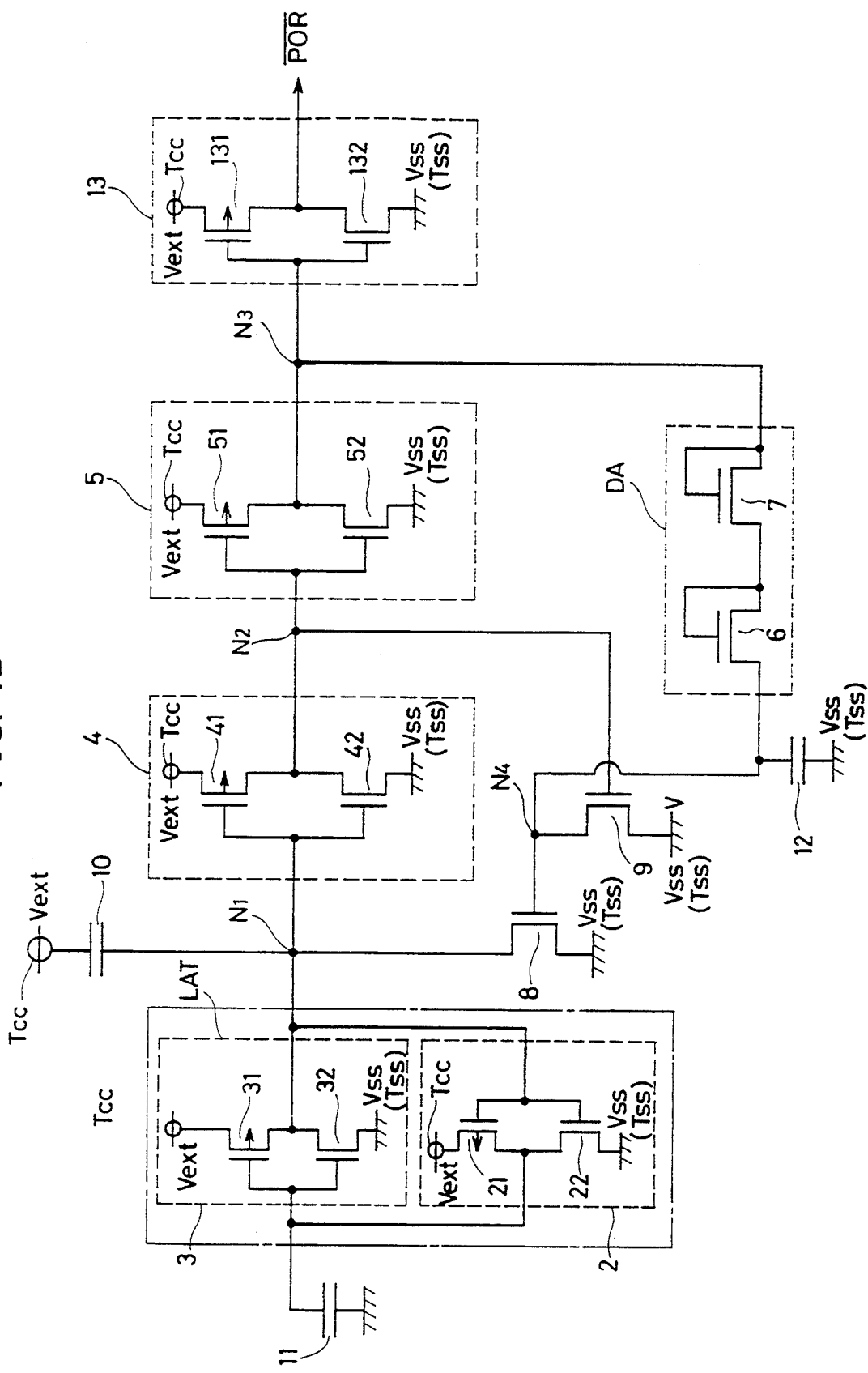

FIG. 4A is a circuit diagram showing one example of a power-on reset signal generating circuit which outputs a one-shot pulse of a low level, showing another embodiment of the present invention. FIG. 4B is a circuit diagram showing in more detail the configuration of the power-on reset signal generating circuit of FIG. 4A.

Referring to FIGS. 4A and 4B, this power-on reset signal generating circuit has such configuration that an inverter 13 for inverting the potential on node N3 is added to the power-on reset signal generating circuit shown in FIGS. 2A and 2B.

Like other inverters 2–5, inverter 13 includes a P channel MOS transistor 131 and an N channel MOS transistor 132 connected in series with each other between a power supply terminal Tcc and a ground terminal Vss. A potential on a node between transistors 131 and 132 is an output terminal of the power-on reset signal generating circuit.

Description will now be given on an operation of the power-on reset signal generating circuit by reference to FIG. 5.

Figure 5:
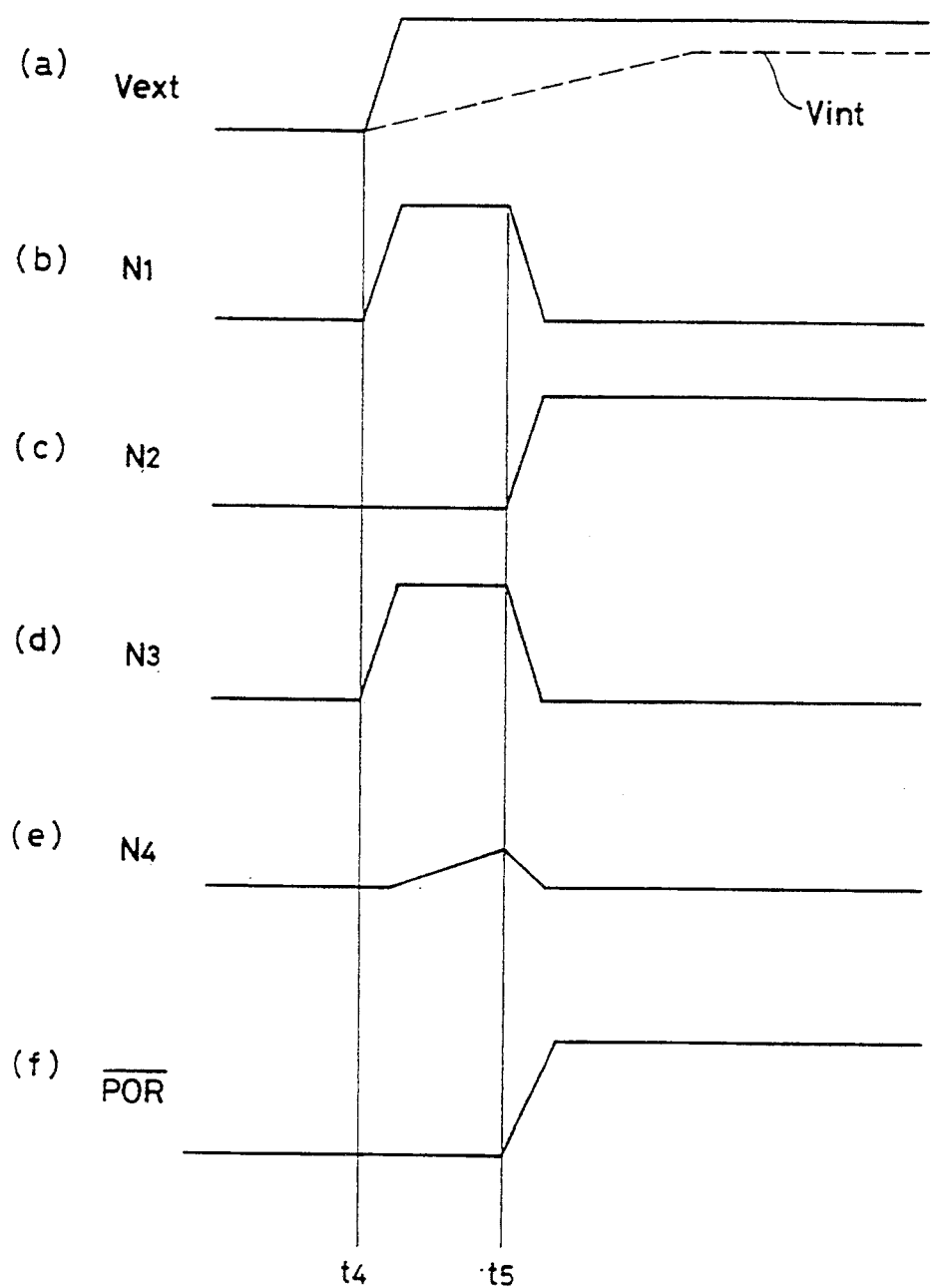
FIGS. 5(a)–(f) is a waveform diagram for use in explaining an operation of the power-on reset signal generating circuit of FIGS. 4A and 4B.

FIG. 5 is a diagram showing signal waveforms appearing on nodes in the power-on reset signal generating circuit shown in FIGS. 4A and 4B.

When an external supply voltage Vext is applied to power supply terminal Tcc, a potential on power supply terminal Tcc immediately attains a high level as shown in FIG. 5(a). Accordingly, all elements other than inverter 13 included in the power-on reset signal generating circuit operate similarly to those in the previous embodiment, so as to change the potentials on nodes N1–N4 as shown in FIG. 5(b) to (e).

After immediately attaining a high level in response to the supply of power at a time t4, the potential on node N3 is kept at the high level until a time t5 when the potential on node N4 reaches the threshold voltage of transistor 8, and then decreases to 0 V. Thus, after the power supply is turned on, transistor 132 is first immediately turned on in inverter 13, and at and after time t5, transistor 131 is fixed in an ON state. Accordingly, an output potential $\overline{POR}$ of inverter 13 is held at a low level during the period between time t4 of the supply of power and time t5, and thereafter fixed at a high level, as shown in FIG. 5(f). That is, a signal being at a low level for a definite period is obtained from the power-on reset signal generating circuit immediately after the power supply is turned on.

The length of the period t4-t5, during which the output potential of the power-on reset signal generating circuit is at a low level after the supply of power, is dependent on the length of a period during which the potential on node N1 is at a high level. More specifically, the potential on node N1 should rapidly rise to a high level immediately after the supply of power in order that the output potential of the power-on reset signal generating circuit is kept at 0 V for a sufficient period after the supply of power. Accordingly, after the supply of power, this power-on reset signal generating circuit becomes able to securely output a one-shot pulse of a low level in response to reception of external supply voltage Vext as a driving voltage.

Figure 6:
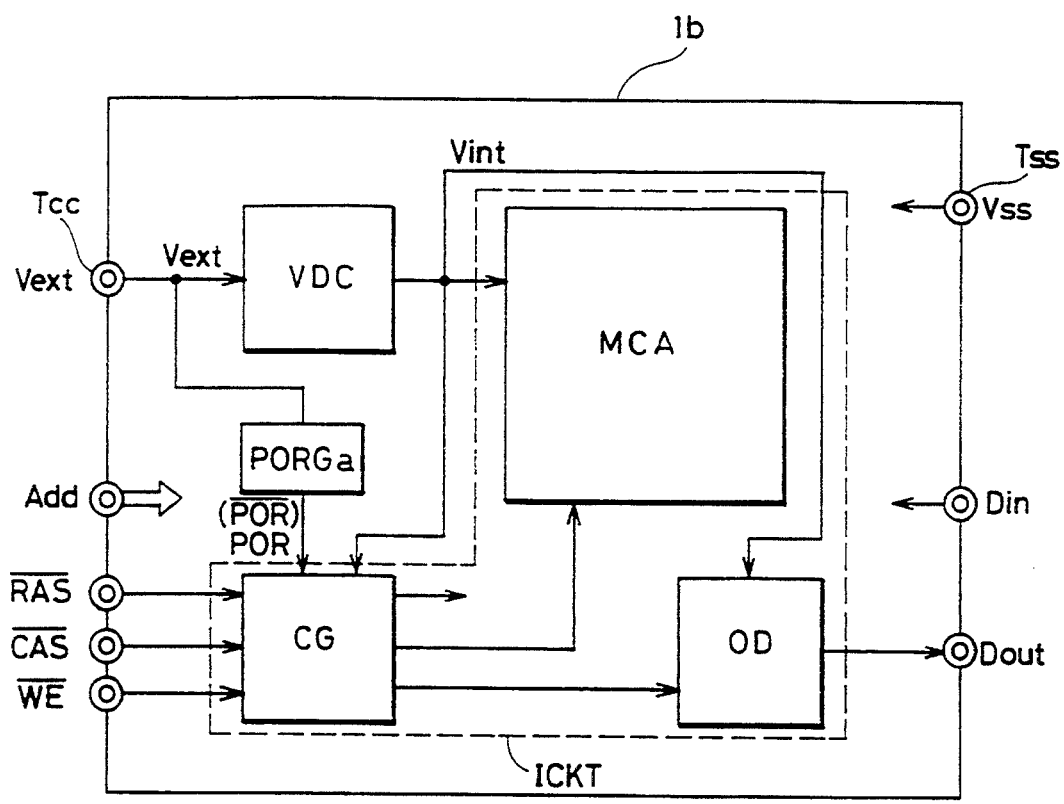
FIG. 6 is a schematic block diagram showing an overall structure of a semiconductor integrated circuit apparatus according to another embodiment of the present invention.

While output driver OD is driven by external supply voltage Vext in DRAM chip 1a of FIG. 1, a power-on reset signal PORGa may be driven by external supply voltage Vext in a DRAM chip 1b configured such that output driver OD is driven by internal supply voltage Vint. FIG. 6 is a schematic block diagram showing an example of the overall structure of DRAM chip 1b in that case, showing a further embodiment of the present invention.

Figure 7:
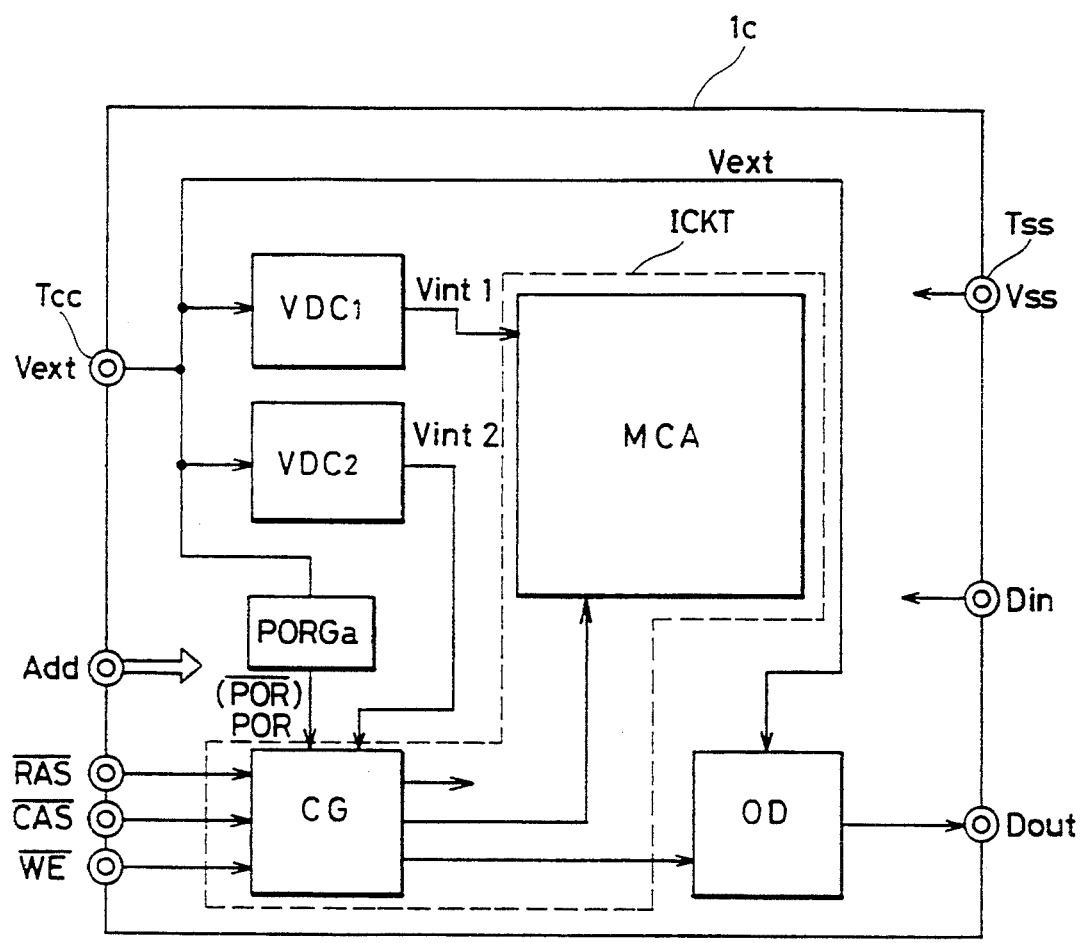
FIG. 7 is a schematic block diagram showing an overall structure of a semiconductor integrated circuit apparatus according to a further embodiment of the present invention.

In addition, power-on reset signal generating circuit PORGa may be driven by external supply voltage Vext in a DRAM chip 1c including a plurality of supply voltage conversion circuits. FIG. 7 is a schematic block diagram showing an example of the overall structure of DRAM chip 1c in that case.

Referring to FIG. 7, when a driving voltage conforming to a gate length of a MOS transistor constituting a memory cell array MCA is different from a driving voltage conforming to a gate length of a MOS transistor constituting a control signal generating circuit CG, for example, an external supply voltage Vext may be lowered to a voltage Vint 1 suitable for driving the MOS transistor in memory cell array MCA and a voltage Vint 2 suitable for driving the MOS transistor in control signal generating circuit CG by supply voltage conversion circuits VDC 1 and VDC 2, respectively.

Figure 8A:
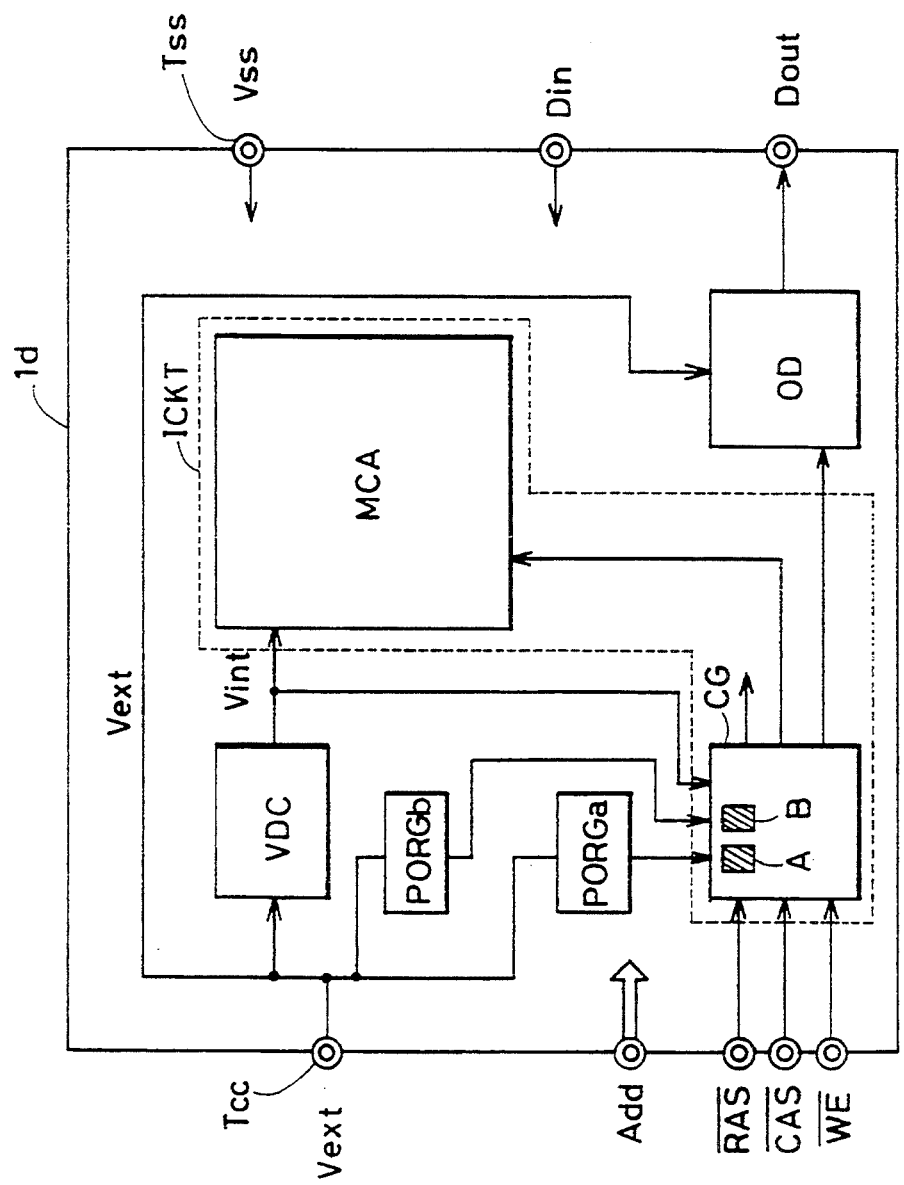
FIG. 8A is a schematic block diagram showing an overall structure of a semiconductor integrated circuit apparatus according to a still further embodiment of the present invention.
Figure 8B:
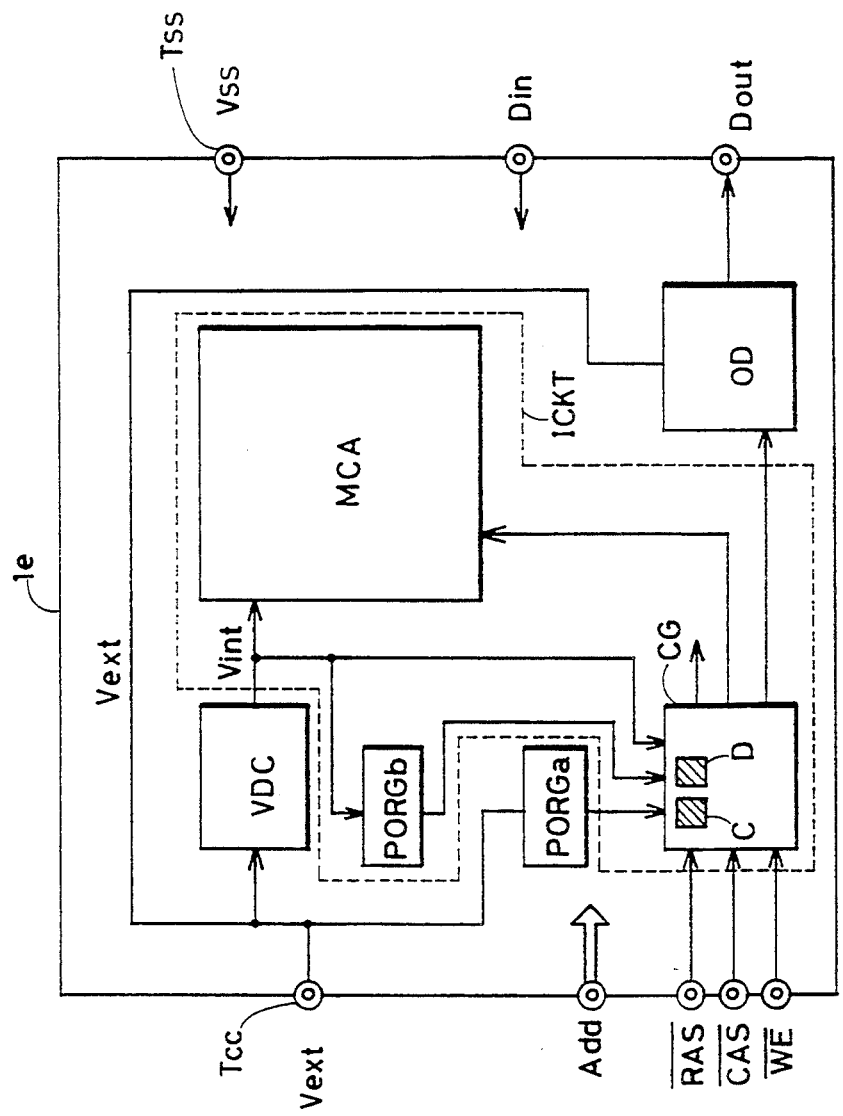
FIG. 8B is a schematic block diagram showing an overall structure of a semiconductor integrated circuit apparatus according to still another embodiment of the present invention.
Figure 9:
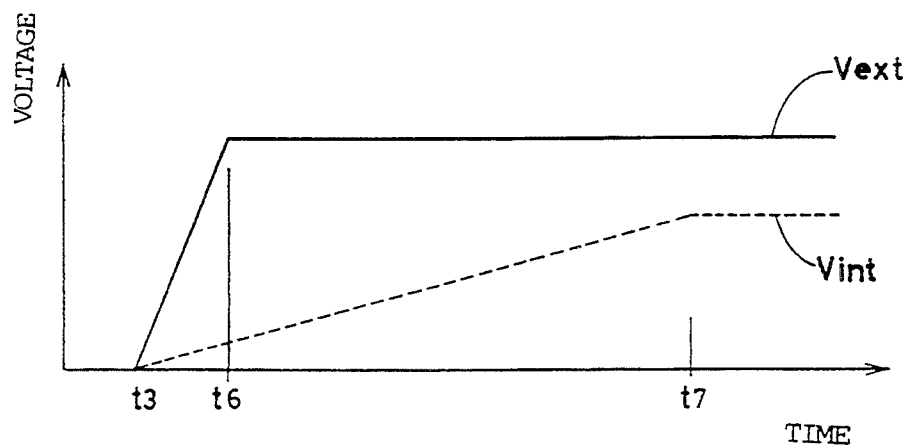
FIG. 9 is a waveform diagram of the characteristics of a supply voltage conversion circuit.
Figure 10:
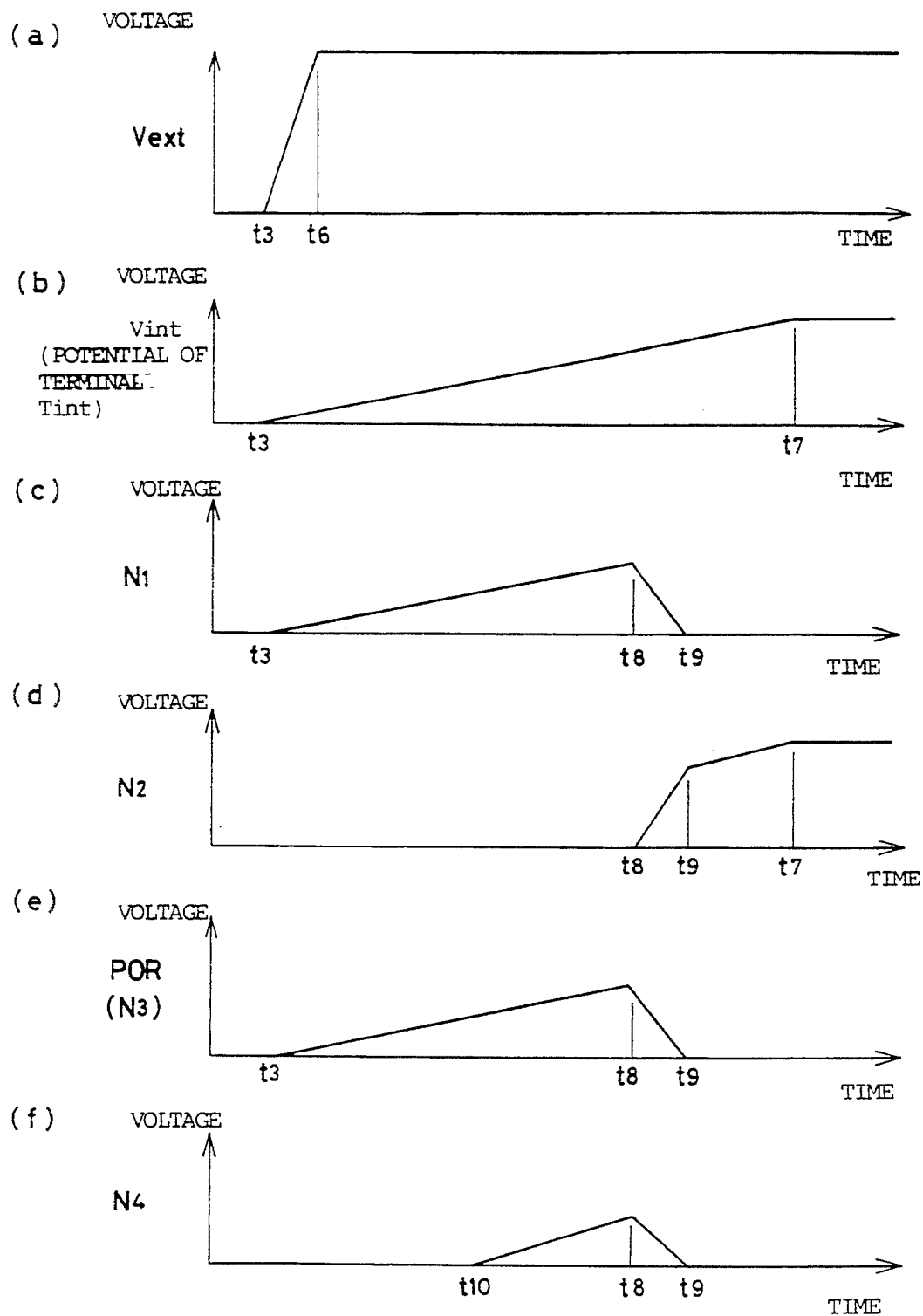
FIG. 10(a)–10(f) are a waveform diagrams of an operation of a power-on reset signal generating circuit in a conventional semiconductor integrated circuit apparatus.

Further, at least any one of a plurality of power-on reset signal generating circuits included in a DRAM chip may be driven by external supply voltage Vext. FIGS. 8A and 8B are schematic block diagrams showing two examples of the overall structure of such a DRAM chip in that case, each showing still another embodiment of the present invention.

Referring to FIG. 8A, such a case is now considered that control signal generating circuit CG, for example, includes respective two circuit portions A and B having respective two potential indefinite nodes (not shown) which should immediately be set in an initial potential in response to the supply of power to a DRAM chip 1d and that a power-on reset signal necessary for setting one of these potential indefinite nodes in the initial potential is different in waveform from a power-on reset signal necessary for setting the other potential indefinite node in the initial potential. In that case, respective outputs of power-on reset signal generating circuits PORGa and PORGb, which are provided independently from each other in order to set those two potential indefinite nodes in the initial potentials, may be employed.

Referring to FIG. 8B, such a case is now considered that control signal generating circuit CG, for example, includes a circuit portion C having a potential indefinite node which should immediately be set in an initial potential in response to the supply of power to a DRAM chip 1e, and a circuit portion D having a potential indefinite node which may be set in an initial potential after a little time has elapsed since the supply of power. An output of power-on reset signal generating circuit PORGa driven by external supply voltage Vext may be employed in order to set the former potential indefinite node in the initial potential, while an output of power-on reset signal generating circuit PORGb driven by internal supply voltage Vint may be employed in order to set the latter potential indefinite node in the initial potential.

For example, the circuits with such configurations as shown in FIGS. 2A and 2B and FIGS. 4A and 4B may be employed for power-on reset signal generating circuits PORGa and PORGb.

In any of the foregoing embodiments, the size of a MOS transistor included in a power-on reset signal generating circuit driven by external supply voltage Vext is designed to be larger than the size of a MOS transistor included in a power-on reset signal generating circuit driven by output voltage Vint of supply voltage conversion circuit VDC.

The present invention can generally be applied to semiconductor integrated circuit apparatus including circuits other than a power-on reset signal generating circuit which are configured to output a voltage of a predetermined level for a definite period by utilizing a rise of a supply voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit apparatus, comprising:
   an external terminal for receiving an external supply voltage;
   internal circuit means driven by a voltage lower than said external supply voltage, said internal circuit means including first and second nodes, each having an unknown potential;
   internal supply voltage applying means connected to said external terminal for lowering said external supply voltage to said lower voltage to apply the lowered voltage to said internal circuit means;
   first signal generating means connected to said external terminal for generating a signal for forcing said first node to be set at an initial potential for a predetermined period after application of said external supply voltage to said external terminal by utilizing a rising of a potential of said external terminal; and
   second signal generating means driven by an output voltage of said internal supply voltage applying means for generating a signal for forcing said second node to be set at an initial potential for predetermined period after application of said external supply voltage to said external terminal by utilizing a rising of an output potential of said internal supply voltage applying means.

* * * * *